(12) United States Patent
Choi et al.

(10) Patent No.: US 10,594,047 B2
(45) Date of Patent: Mar. 17, 2020

(54) FUNCTIONAL CONTACTOR

(71) Applicant: AMOTECH CO., LTD., Incheon (KR)

(72) Inventors: Jae Woo Choi, Gyeonggi-do (KR); Byung Guk Lim, Incheon (KR); Seong Ha Lee, Incheon (KR); Yun Suk Choi, Incheon (KR); Dong Hun Kong, Incheon (KR)

(73) Assignee: AMOTECH CO., LTD., Incheon (KR)

( * ) Notice: Subject to any disclaimer, the term of this patent is extended or adjusted under 35 U.S.C. 154(b) by 0 days.

(21) Appl. No.: 16/301,053

(22) PCT Filed: May 12, 2017

(86) PCT No.: PCT/KR2017/004930
§ 371 (c)(1),
(2) Date: Nov. 13, 2018

(87) PCT Pub. No.: WO2017/196116
PCT Pub. Date: Nov. 16, 2017

(65) Prior Publication Data
US 2019/0190167 A1   Jun. 20, 2019

(30) Foreign Application Priority Data

May 12, 2016  (KR) .................. 10-2016-0058312
May 30, 2016  (KR) .................. 10-2016-0066738
(Continued)

(51) Int. Cl.
*H01R 12/00* (2006.01)
*H01R 4/02* (2006.01)
(Continued)

(52) U.S. Cl.
CPC ............. *H01R 4/028* (2013.01); *H01R 4/027* (2013.01); *H01R 12/714* (2013.01);
(Continued)

(58) Field of Classification Search
CPC ..... G01R 31/2886; H01L 33/486; H01C 7/12; H01R 12/707; H01R 13/2428;
(Continued)

(56) References Cited

U.S. PATENT DOCUMENTS 6,486,688 B2 * 11/2002 Taura ................. G01R 31/2886
                                                        324/754.2
6,538,197 B1    3/2003 Kawai
2012/0168792 A1 *  7/2012 Kang ..................... H01L 33/486
                                                        257/94

FOREIGN PATENT DOCUMENTS

JP   2011-014451   1/2011
JP   2011-233495   11/2011
(Continued)

OTHER PUBLICATIONS

International Search Report and Written Opinion issued in International Patent Application No. PCT/KR2017/004930, dated Sep. 8, 2017.

*Primary Examiner* — Jean F Duverne
(74) *Attorney, Agent, or Firm* — Norton Rose Fulbright US LLP

(57) ABSTRACT

A functional contactor is provided. The functional contactor according to one embodiment of the present invention includes: a conductive elastic portion configured to be in electrical contact with a conductor of an electronic device and have elasticity; and a functional device including a first electrode electrically connected to a circuit board or the conductor of the electronic device and a second electrode on which the conductive elastic portion is laminated through solder. Here, the second electrode includes a stopper in which no electrode is formed to prevent the solder from being introduced into a periphery of a lamination region on which the conductive elastic portion is laminated.

19 Claims, 20 Drawing Sheets

(30) Foreign Application Priority Data

May 30, 2016 (KR) .......................... 10-2016-0066748
May 11, 2017 (KR) .......................... 10-2017-0058607

(51) Int. Cl.
| | | |
|---|---|---|
| *H01R 12/71* | (2011.01) | |
| *H05K 1/18* | (2006.01) | |
| *H05K 1/02* | (2006.01) | |
| *H05K 3/34* | (2006.01) | |
| *H05K 9/00* | (2006.01) | |
| *H01R 13/24* | (2006.01) | |

(52) U.S. Cl.
CPC ......... *H05K 1/0215* (2013.01); *H05K 1/0259* (2013.01); *H05K 1/181* (2013.01); *H05K 3/3431* (2013.01); *H01R 13/2407* (2013.01); *H01R 13/2442* (2013.01); *H05K 9/0049* (2013.01); *H05K 2201/10015* (2013.01); *H05K 2201/1031* (2013.01); *H05K 2201/10196* (2013.01); *H05K 2201/10515* (2013.01)

(58) Field of Classification Search
CPC . H04M 1/0202; H05K 9/0009; H05K 9/0015; H05K 9/0016; H05K 9/0067; H05K 2201/0314; H05K 2201/10265
USPC .......................................................... 439/81
See application file for complete search history.

(56) References Cited

FOREIGN PATENT DOCUMENTS

| KR | 2007-0109332 | 11/2007 |
|---|---|---|
| KR | 10-1334237 | 11/2013 |
| KR | 10-1585604 | 1/2016 |

* cited by examiner

FUNCTIONAL CONTACTOR

CROSS-REFERENCE TO RELATED APPLICATIONS

This application is a national phase application under 35 U.S.C. § 371 of International Application No. PCT/KR2017/004930, filed May 12, 2017, which claims priority to and the benefit of Korean Patent Applications No. 10-2016-0058312, filed May 12, 2016, No. 10-2016-0066738, filed May 30, 2016, No. 10-2016-0066748, filed May 30, 2016, and No. 10-2017-0058607, filed May 11, 2017. The contents of the referenced patent applications are incorporated into the present application by reference.

FIELD OF THE DISCLOSURE

The present invention relates to a contactor for an electronic device such as a smart phone, and more particularly, to a functional contactor in which it is possible to stably align a contactor coupled onto a functional device by soldering and also to minimize structural interference after the coupling.

DESCRIPTION OF RELATED ART

Recent portable electronic devices are increasingly employing metal housings to improve appearance and strength. Such a portable device employs a conductive gasket or a conductive contactor between an external housing and an internal circuit board thereof to reduce electromagnetic waves leaking therefrom and establish electrical contact between an antenna disposed in the external housing and the internal circuit board while lessening impact from the outside thereof.

However, an electrical path may be formed between the external housing, such as a metal case, and the internal circuit board due to the conductive gasket or the conductive contactor. Therefore, when static electricity having an instantaneously high voltage flows in through the conductor, such as the external metal case, the static electricity may flow into the internal circuit board and destroy circuitry such as an integrated circuit (IC). Also, leakage current generated by an alternating current (AC) power supply may flow to the external housing through a grounding portion of circuitry and give an uncomfortable feeling to a user. In some severe cases, the leakage current causes an electric shock accident which may do harm to the user.

Further, when the metal housing is used as an antenna, the conductive gasket or the conductive contactor results in signal attenuation with a low capacitance, and radio frequency (RF) signals are not smoothly transferred. Therefore, it is necessary to achieve a high capacitance.

A protection device for protecting a user from such static electricity or leakage current is provided with the conductive gasket or the conductive contactor which connects the metal housing and the circuit board, and a conductor such as the metal case is used. Accordingly, there is a need for a functional contactor which has various functions, not only for simple electrical contact, but also for protecting a user or circuitry in a portable electronic device or smoothly transferring communication signals.

As regards such a functional contactor, when an area of an electrode is increased in order to increase a capacitance of a functional device, printed solder exists in a liquid state in a process of laminating the contactor of a relatively small size on an electrode by soldering or a process of mounting a functional device on which the contactor has been laminated by soldering on a circuit board by second soldering. For this reason, a conductive elastic portion is not fixed and may deviate from an original position, and thus many defective products are produced.

In addition, when a conductive contactor is coupled to a protection device, instrumental interference may occur due to a coupling structure, and functions of a functional contactor manufactured thereby are degraded.

SUMMARY OF THE INVENTION

To solve the aforementioned problems, the present invention is directed to providing a functional contactor in which a stopper function is added to an electrode of a large-sized functional device to ensure alignment of the contactor and prevent a wobble even when soldering is performed for device coupling or mounting.

The present invention is also directed to providing a functional contactor in which a soldering prevention function is added to an electrode of a functional device to which a clip-shaped conductor is coupled by soldering so that structural interference caused by a coupling structure with the contactor may be minimized.

One aspect of the present invention provides a functional contactor including: a conductive elastic portion configured to be in electrical contact with a conductor of an electronic device and have elasticity; and a functional device including a first electrode electrically connected to a circuit board or the conductor of the electronic device and a second electrode on which the conductive elastic portion is laminated through solder. Here, the second electrode includes a stopper in which no electrode is formed to prevent the solder from being introduced into a periphery of a lamination region on which the conductive elastic portion is laminated.

According to an exemplary embodiment of the present invention, the stopper may be provided to touch at least a part of the lamination region.

Here, the stopper may be provided at least a diagonal point of a corner of the lamination region.

Also, the stopper may be formed through masking or overglazing.

Also, the functional contactor may further include a fixing member configured to surround at least a part of a boundary of the conductive elastic portion.

Here, the fixing member may be a non-conductive resin including any one of overglass, epoxy, epoxy with fillers, a polymer, and a non-conductive paste.

Also, the conductive elastic portion may be any one of a conductive gasket, a silicone rubber pad, and a C-clip.

Another aspect of the present invention provides a functional contactor including a clip-shaped conductor configured to be in electrical contact with a conductor of an electronic device and have elasticity and including a functional device including a first electrode electrically connected to a circuit board or the conductor of the electronic device and a second electrode on which the clip-shaped conductor is laminated through solder. Here, the second electrode is separately formed into a plurality of regions so that the solder may not be exposed to a bending portion formed in the clip-shaped conductor.

According to an exemplary embodiment of the present invention, the second electrode may be separately formed into three regions, and two electrodes positioned at both ends may be symmetrically formed in identical or similar sizes.

Here, among the three regions, at least one region corresponding to the bending portion may not be exposed to the solder.

Also, the second electrode may be separately formed into the plurality of regions through masking or overglazing.

Also, the first electrode may be formed in a pattern identical or similar to a pattern of the second electrode.

Another aspect of the present invention provides a functional contactor including a clip-shaped conductor configured to be in electrical contact with a conductor of an electronic device and have elasticity and including a functional device including a first electrode electrically connected to a circuit board or the conductor of the electronic device and a second electrode on which the clip-shaped conductor is laminated through solder. Here, a coating layer is formed on at least a part of a surface of the second electrode so that the solder may not be exposed to a bending portion formed in the clip-shaped conductor.

According to an exemplary embodiment of the present invention, the coating layer may determine wetness of the second electrode with the solder using at least one of ceramic and a non-flammable petroleum compound.

Also, the second electrode may be formed in a pattern identical or similar to a pattern of a terminal portion and the coating layer may be formed in a region of the second electrode corresponding to the bending portion.

Also, the second electrode may be formed on an upper surface of the functional device to be exposed to an outside of a terminal portion and the coating layer may be formed to exclude a region corresponding to a pattern of the second electrode and include a region corresponding to the bending portion.

Also, the coating layer may be formed on the surface of the second electrode through masking or overglazing.

Also, the clip-shaped conductor may include a contact portion configured to be in contact with the conductor, a curved portion having elasticity, and a terminal portion configured to be in contact with the second electrode of the functional device.

Also, the functional device may have at least one function among an electric shock prevention function for breaking leakage current of an external power supply flowing in from a ground of the circuit board of the electronic device, a communication signal transfer function for passing along a communication signal flowing in from a conductive case or the circuit board, and an electrostatic discharge (ESD) protection function for passing static electricity without dielectric breakdown when the static electricity flows in from the conductive case.

According to the present invention, no electrode of a large-area functional device is formed around a lamination region of a contactor. When the contactor is laminated on the functional device by soldering, it is possible to prevent introduction of solder and correct alignment of the contactor. Therefore, stable coupling is possible, and a defect can be prevented.

According to the present invention, a stopper in which no electrode is formed is provided in a lamination region of a contactor. When a functional contactor is mounted on a circuit board by soldering, the contactor is confined in a stopper region, and it is possible to prevent a wobble of the contactor even in two reflow processes. Therefore, a soldering process can be stably and readily performed, and production efficiency can be improved.

According to the present invention, a second electrode separated into a plurality of regions is disposed on a sintered body to which a clip-shaped conductor is coupled, and electrodes disposed at both ends of the second electrode are symmetrically formed in identical or similar sizes. Therefore, it is possible to prevent a problem wherein the clip-shaped conductor is wrongly disposed in an electrode structure which is asymmetrically divided.

According to the present invention, a second electrode separated into a plurality of regions is disposed on a sintered body. Therefore, it is possible to reduce a decrease in adhesive strength caused by a reduction in solder area and reduce a decrease in capacitance caused by a reduction in electrode area. Also, it is possible to ensure a degree of freedom in electrode design based on capacitance.

According to the present invention, a first electrode is formed on a sintered body in a pattern identical or similar to a pattern of a second electrode. For this reason, when a clip-shaped conductor is coupled, by soldering, to a functional device on which the electrodes have been formed, it is possible to omit a process of distinguishing between upper and lower portions of the functional device and a process of determining a direction in which the clip-shaped conductor is aligned with the functional device. Therefore, it is possible to simplify a manufacturing process of a functional contactor and reduce costs accordingly.

According to the present invention, a process for soldering a clip-shaped conductor to a functional device is performed so that solder may not be exposed to a coating layer of an electrode corresponding to a bending portion. Accordingly, it is possible to prevent a decrease in elasticity and restoring force and prevent damages, such as cracks and degradation, which may be caused in a bending portion and a part of a curved portion connected to the bending portion during the soldering process.

According to the present invention, a bending portion in which tension is exerted continuously or repeatedly is not fixed to a functional device by a formed coating layer. Therefore, elasticity and restoring force of a clip-shaped conductor are increased, and it is possible to prevent a minute change in capacitance and/or a change in constant voltage characteristics caused by movement of the bending portion.

According to the present invention, a coating layer is formed in a partial region of an electrode corresponding to a bending portion. For this reason, solder can be selectively positioned on an electrode on which a coating layer has not been formed according to a pattern of the coating layer, and it is easy to align a position of a clip-shaped conductor coupled onto the electrode. Therefore, it is possible to uniformly maintain quality of a contactor relating to capacitance and constant voltage characteristics.

DETAILED DESCRIPTION OF THE INVENTION

Figure 1:
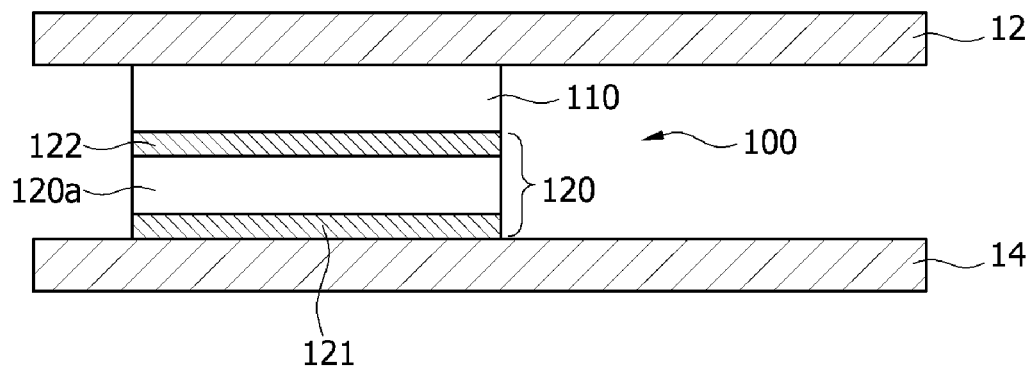
FIG. 1 is a cross-sectional view of a functional contactor according to an embodiment of the present invention.

Hereinafter, embodiments of the present invention will be described in detail with reference to the accompanying drawings so that those of ordinary skill in the technical field to which the present invention pertains may easily implement the invention. The present invention may be implemented in various different forms and is not limited to embodiments that are described herein. In the drawings, parts irrelevant to description are omitted to clearly describe the present invention, and throughout the specification, like or similar components are indicated by like reference numerals.

Figure 2:
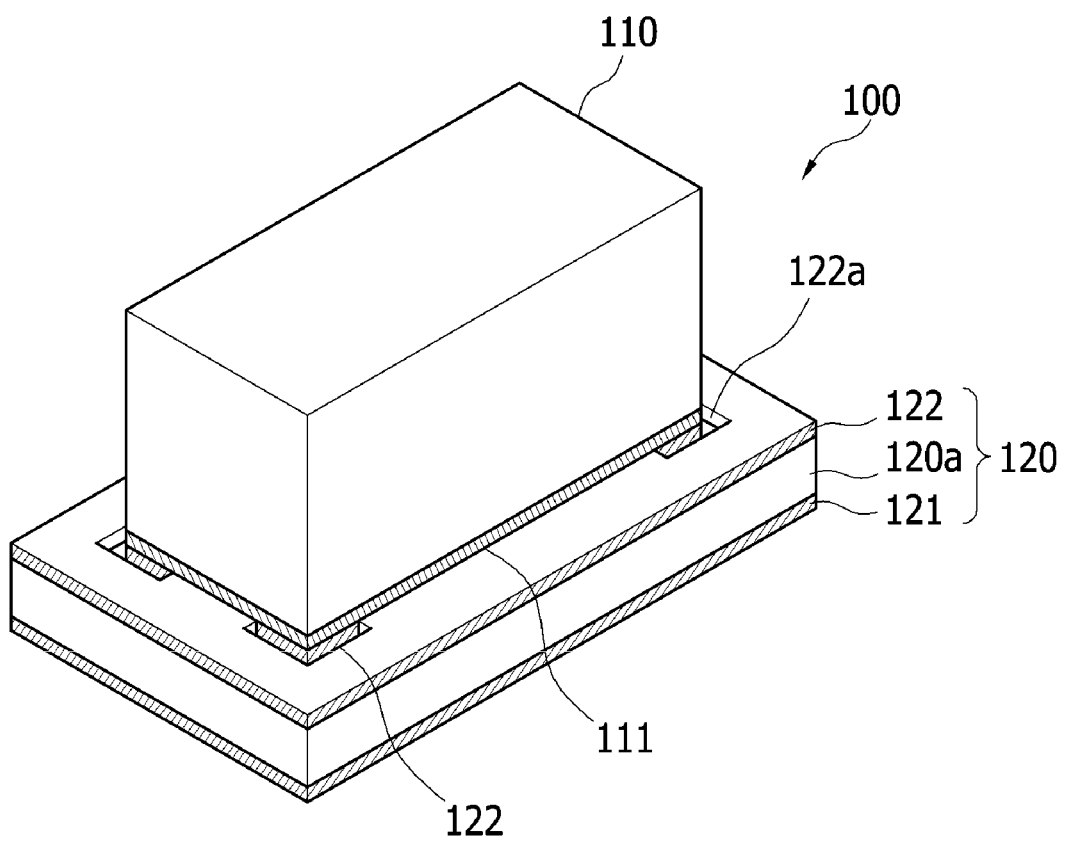
FIGS. 2 and 3 are a perspective view and a cross-sectional view of a functional contactor according to a first embodiment of the present invention.
Figure 3:
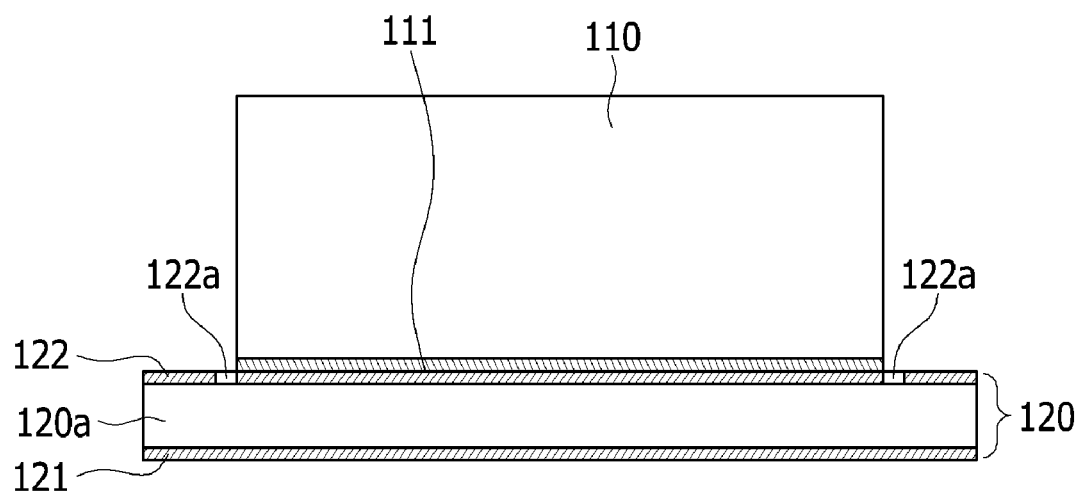

As shown in FIGS. 1 to 3, a functional contactor 100 according to a first embodiment of the present invention includes a conductive elastic portion 110 and a functional device 120.

As shown in FIG. 1, the functional contactor 100 is intended to electrically connect a conductor 12, such as an external metal case (a conductive case or a conductive housing), and a circuit board 14 in a portable electronic device.

When the circuit board 14 is electrically connected to a conductive bracket or a shield can is mounted on the circuit board 14, the functional contactor 100 may electrically connect the external conductor, such as the metal case, and the internal conductor, such as the conductive bracket or the shield can. The conductive bracket may be made from a conductive material, for example, magnesium (Mg).

Meanwhile, the portable electronic device may be in the form of portable electronic equipment which is portable and may be easily carried. For example, the portable electronic device may be a portable terminal, such as a smart phone and a cellular phone, and may be a smart watch, a digital camera, a digital multimedia broadcasting (DMB) device, an e-book, a netbook, a tablet personal computer (PC), a portable computer, and the like. These electronic devices may have any appropriate electronic components including antenna structures for communication with an external device. Also, the electronic devices may use short-range network communication such as wireless fidelity (WiFi) and Bluetooth.

The external conductor may be provided, for example, to surround the whole or a part of a side surface of the portable electronic device and may be an antenna for communication between the portable electronic device and an external device.

The functional contactor 100 may be mounted on the circuit board 14 through solder. In other words, the functional contactor 100 may be mounted on the circuit board 14 through a surface mount (SMT) soldering process.

Also, the functional contactor 100 may be coupled to any one of the external conductor, such as the metal case, and the internal conductor, such as the bracket or the shield can, through a conductive adhesive layer. In this regard, when it is difficult to couple the functional contactor 100 by soldering, the functional contactor 100 is coupled through a conductive adhesive layer so that the degree of freedom in design may be improved. The conductive adhesive layer may be a conductive adhesive film.

The conductive elastic portion 110 may be in electrical contact with the conductor 12 and may have elasticity. The conductive elastic portion 110 may be a conductive gasket, a silicone rubber pad, and a clip-shaped conductor having elasticity.

When the conductive elastic portion 110 is in contact with the conductor 12, the conductive elastic portion 110 may contract toward the circuit board 14 due to a pressure of the conductor 12. When the conductor 12 is separated, the conductive elastic portion 110 may be restored to an original state due to an elastic force thereof.

When the conductive elastic portion 110 is in contact with the conductor 12, galvanic corrosion occurs due to a potential difference between different kinds of metal. To minimize galvanic corrosion at this time, the conductive elastic portion 110 may have a small area that is in contact with the conductor 12.

In other words, the conductive elastic portion 110 may be configured to not only be in surface contact but also in linear and/or point contact with the conductor 12. For example, when the conductive elastic portion 110 is a conductive gasket or a silicone rubber pad, the conductive elastic portion 110 may be in surface contact with the conductor 12, and when the conductive elastic portion 110 is a clip-shaped conductor, the conductive elastic portion 110 may be in linear contact and/or point contact with the conductor 12.

As described above, one side of the conductive elastic portion 110 may be in contact with the conductor 12, and the other side may be electrically connected to the functional device 120.

The functional device 120 is electrically connected to the conductive elastic portion 110 in series and includes a first electrode 121 and a second electrode 122 which have a large area in order to increase capacitance.

The first electrode 121 is electrically connected to the circuit board 14 or the conductor 12 of the electronic device. At this time, the first electrode 121 may be mounted on the circuit board 14 through solder by an SMT soldering process.

Also, the first electrode 121 may be coupled to the internal conductor, such as the bracket or the shield can, or the external conductor, such as the metal case, through the conductive adhesive layer.

The conductive elastic portion 110 is laminated on the second electrode 122 through solder 111. In other words, the conductive elastic portion 110 may be laminated on the second electrode 122 by an SMT soldering process.

Figure 4:
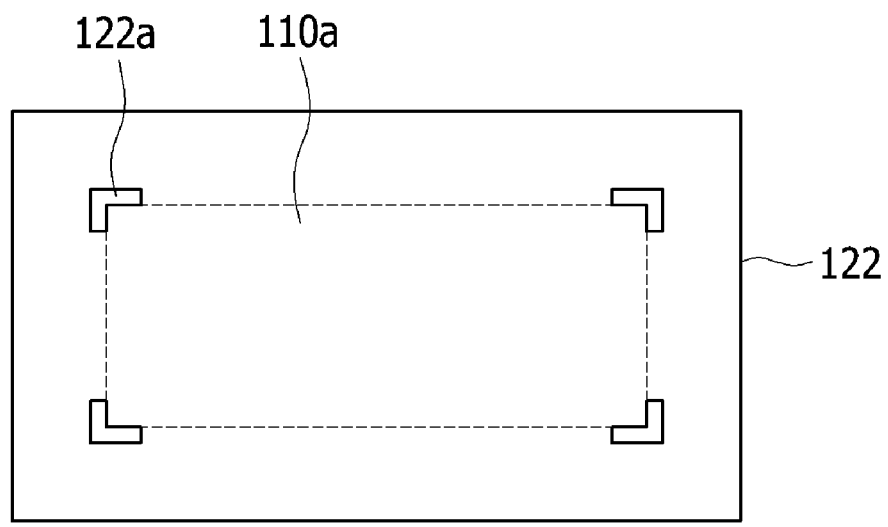
FIGS. 4 to 7 are top-down views showing various shapes of a stopper in the functional contactor according to the first embodiment of the present invention.

As shown in FIGS. 2 to 4, the second electrode 122 includes stoppers 122a in which no electrode is formed around a lamination region 110a in which the conductive elastic portion 110 is laminated.

For example, the stoppers 122a may be provided at at least diagonal points of corners of the lamination region 110a. In this case, the stoppers 112a may be formed in "⌐" or "L" shapes to touch parts of corners of the conductive elastic portion 110 at four corners of the lamination region 110a (see FIG. 4). Since no electrode is formed at the stoppers 122a, the stoppers 122a prevent introduction of the solder 111 in a liquid state during the SMT soldering process.

After the second electrode 122 is formed, the stoppers 122a may be formed by removing the electrode through masking in which a mask having a stopper shape is used. Alternatively, the stoppers 122a may be formed as a glass film by overglassing at removed portions of the electrode.

As described above, no electrode of the large-area functional device 120 is formed around the lamination region 110a of the contactor, such as a conductive elastic portion. When the conductive elastic portion 110 is laminated on the functional device 120 by soldering, the liquid solder 111 is introduced onto the electrode but is not introduced into the stoppers 122a. For this reason, it is possible to correct alignment of the conductive elastic portion 110. Therefore, the conductive elastic portion 110 may be stably coupled to the functional device 120, and it is possible to prevent a defect caused in the SMT soldering process.

In particular, when the functional contactor 100 is mounted on the circuit board 14 by SMT soldering, two reflow processes are performed. At this time, the stoppers 122a are provided in the lamination region 110a of the conductive elastic portion 110 so that the conductive elastic portion 110 may be confined by the stoppers 122a.

In other words, during the SMT soldering process for mounting the functional contactor 100 on the circuit board 14, the solder 111 is not introduced into the stoppers 122a even if the solder 11 between the conductive elastic portion 110 and the functional device 120 melts at a high temperature. Therefore, a wobble of the conductive elastic portion 110 may be prevented by the stoppers 122a.

As a result, even when two reflow processes are performed, it is possible to prevent alignment and a wobble of the conductive elastic portion 110 due to the stoppers 122a provided on the second electrode 122 of a large area, and thus the soldering process may be stably and readily performed.

Therefore, it is unnecessary to align the conductive elastic portion 110 in the soldering process, and it is possible to reduce defective products caused by a wobble of the conductive elastic portion 110 so that production efficiency may be improved.

The stoppers 122a have been shown and described to surround the lamination region 110a along the boundary of the conductive elastic portion 110 (see FIG. 4). However, the stoppers 122a are not limited to the configuration and may be provided to touch at least a part of the lamination region 110a so that the conductive elastic portion 110 may be confined by the stoppers 122a.

Figure 5:
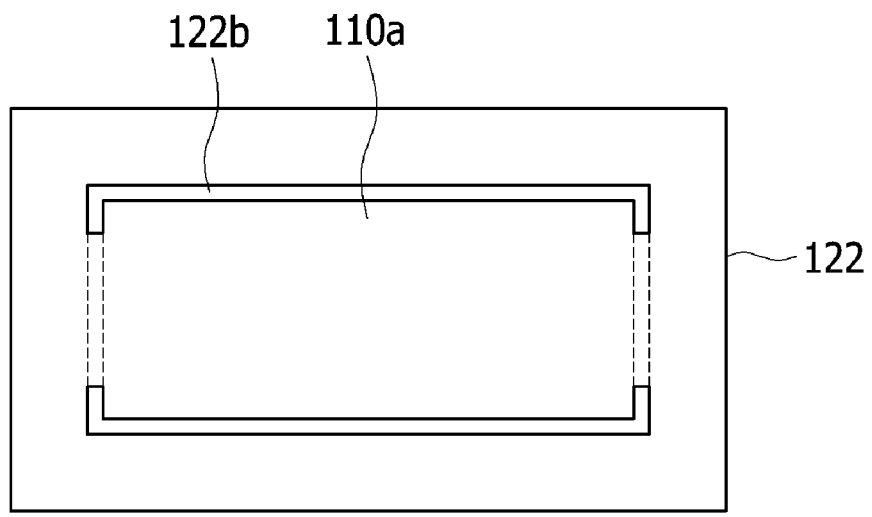

For example, stoppers 122b may be provided to touch at least two sides of the lamination region 110a (see FIG. 5). In this case, the stoppers 122b may be provided on the upper and lower sides of the lamination region 110a in the drawing to confine the conductive elastic portion 110 in balance. However, the stoppers 122a are not limited to this configuration and may be provided on the left and right sides.

Figure 6:
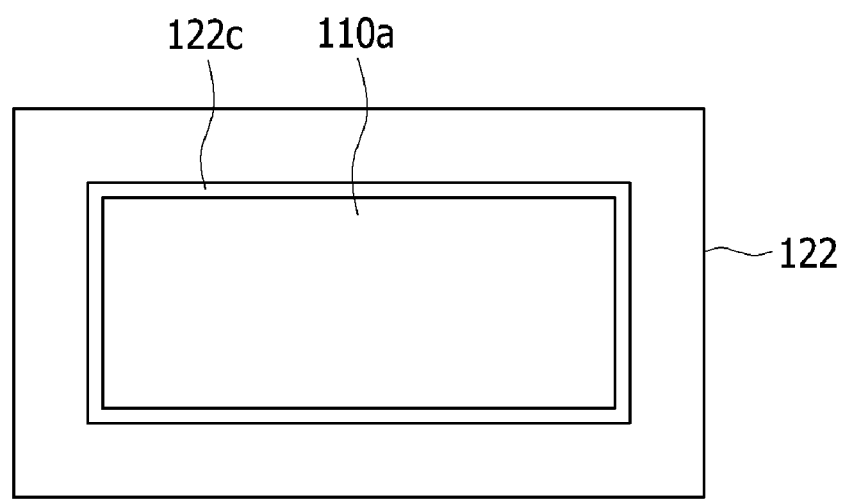

Also, a stopper 122c may be provided to surround the lamination region 110a along the boundary of the conductive elastic portion 110 (see FIG. 6). In this case, the lamination region 110a may be separated from the entire second electrode, and the stopper 122c may be provided along the whole boundary of the conductive elastic portion 110 so that movement of the functional device 110 may be prevented more safely.

Figure 7:
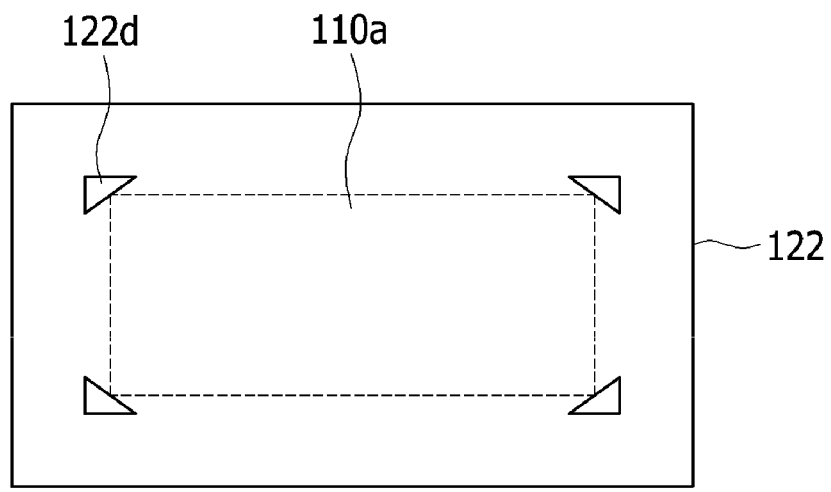

As in FIG. 4, stoppers 122d may be provided at at least diagonal points of corners of the lamination region 110a (see FIG. 7). In this case, the stoppers 122d may be provided at the diagonal points to be in surface contact or point contact with the lamination region 110a.

As an example, the stoppers 122d may be formed as a triangle or inverted triangle shape at the four corners of the lamination region 110a to be in point contact with the conductive elastic portion 110 (see FIG. 7).

The shapes of stoppers shown in the drawings are merely examples, and stoppers are not limited thereto. Stoppers are not limited to a specific shape as long as they may immobilize the functional device 120 at at least parts of the boundary of the functional device 120.

Meanwhile, in addition to or instead of the stoppers, the functional contactor may include a fixing member 130 for aligning and fixing the conductive elastic portion 110 on the second electrode 122.

Figure 8:
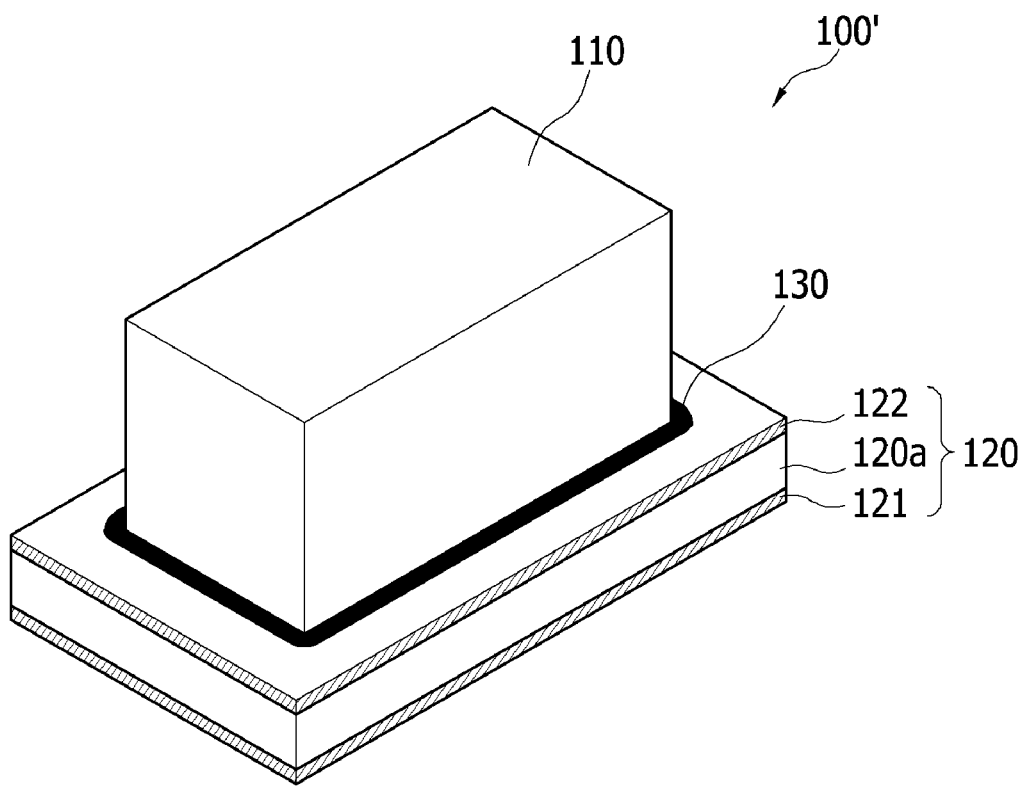
FIGS. 8 and 9 are a perspective view and a cross-sectional view showing another example of the functional contactor according to the first embodiment of the present invention.
Figure 9:
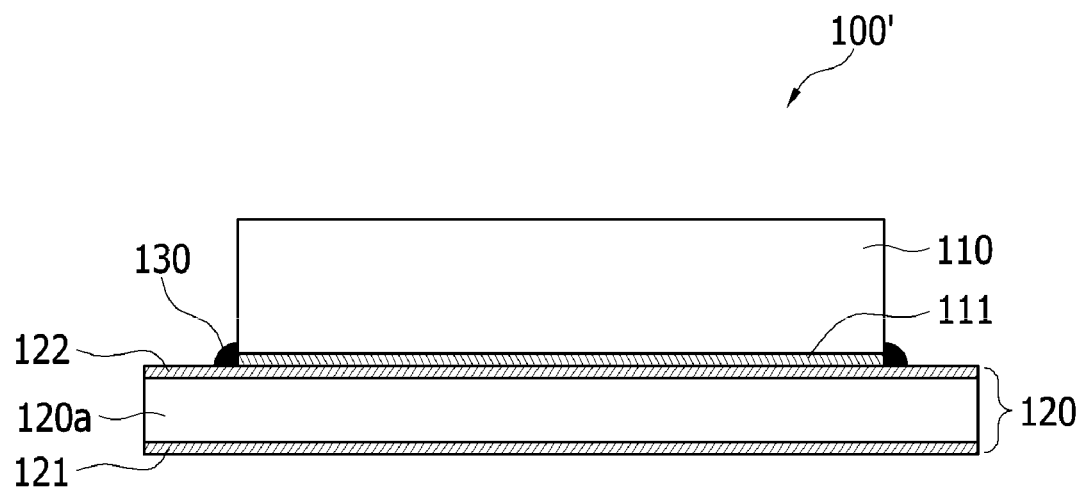

As shown in FIGS. 8 and 9, a functional contactor 100' may include a fixing member 130 surrounding at least a part of the boundary of the conductive elastic portion 110. The fixing member 130 may be a non-conductive resin including any one of overglass, epoxy, epoxy with fillers, a polymer, and a non-conductive paste.

The non-conductive paste may harden at a temperature lower than a melting point of solder which is mainly composed of Sn. When the non-conductive resin is composed of a high temperature cure resin which has a higher melting point than solder, the texture of an electrode or a plating is changed, and thus soldering is not easy. As an example, the non-conductive resin may be a low temperature cure resin which is cured at 140° C. to 210° C.

Further, the non-conductive resin may be pyrolyzed at a temperature higher than a melting point of solder 101 so as not to be affected by an SMT process for forming solder. In other words, even when a solder paste applied in the fixing member 130 is heated to a melting point thereof in the SMT process for coupling the conductive elastic portion 110 to the functional device 120, the non-conductive resin may not be pyrolyzed, and only the solder paste may be melted.

The fixing member 130 may be provided before or after a process of soldering the conductive elastic portion 110 onto the second electrode 122 of the functional device 120.

The fixing member 130 surrounds at least a part of the boundary of the conductive elastic portion 110. For this reason, when the conductive elastic portion 110 is laminated on the functional device 120 by soldering, the conductive elastic portion 110 may be aligned at an accurate position. Also, since the conductive elastic portion 110 is immobilized by the fixing member 130, deviation of the conductive elastic portion 110 caused by melted liquid solder is prevented so that an electrical or instrumental defect caused in the SMT soldering process may be prevented.

Figure 10:
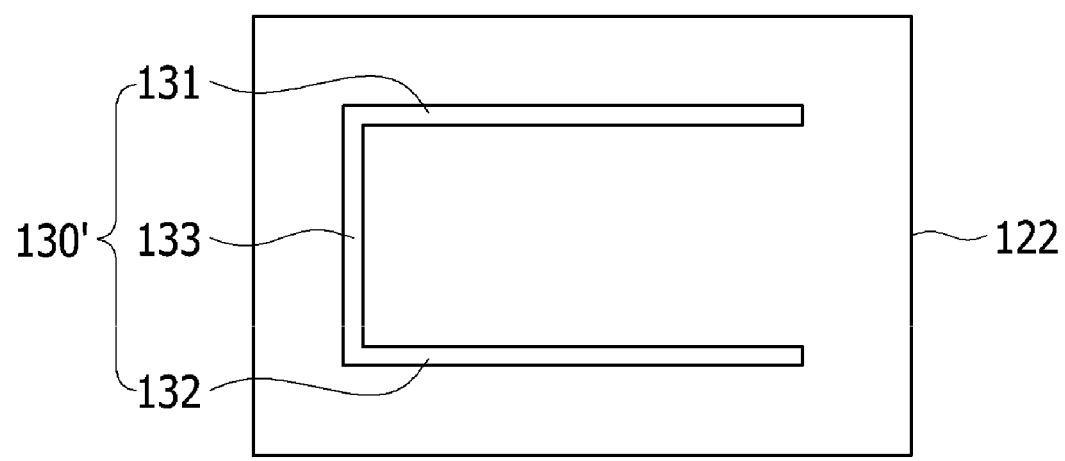
FIGS. 10 to 13 are top-down views showing modified examples of a fixing member in the functional contactor of FIG. 9.

As shown in FIG. 10, when the conductive elastic portion 110 is a clip-shaped conductor, a fixing member 130' may not be formed in a region in which a curved portion of the clip-shaped conductor having elasticity is disposed.

In other words, since the curved portion is required to be flexible so as to provide elasticity of the clip-shaped conductor, the curved portion may not be confined by the fixing member 130', and the fixing member 130' may be formed to surround not the entire, but only a part of, the clip-shaped conductor or the conductive elastic portion 110. As an example, the fixing member 130' may be formed in a "⊏" shape.

The fixing member 130' may include a first portion 131, a second portion 132, and a third portion 133.

The first portion 131 and the second portion 132 may be formed in a width direction on both sides of the clip-shaped conductor, and the third portion 133 may vertically connect the first portion 131 and the second portion 132.

In this way, the fixing member 130' is in contact with three sides of the boundary of the clip-shaped conductor. Therefore, the clip-shaped conductor or the conductive elastic portion 110 is aligned at an accurate position by the fixing member 130'. Also, since the fixing member 130' restricts the clip-shaped conductor or the conductive elastic portion 110 from being moved by melted solder, it is possible to ensure deviation of the clip-shaped conductor or the conductive elastic portion 110.

However, the fixing member 130' is not limited to the above-described shape and may be formed in various forms that may align the position of the clip-shaped conductor or the conductive elastic portion 110 and confine a part of melted solder.

Figure 11:
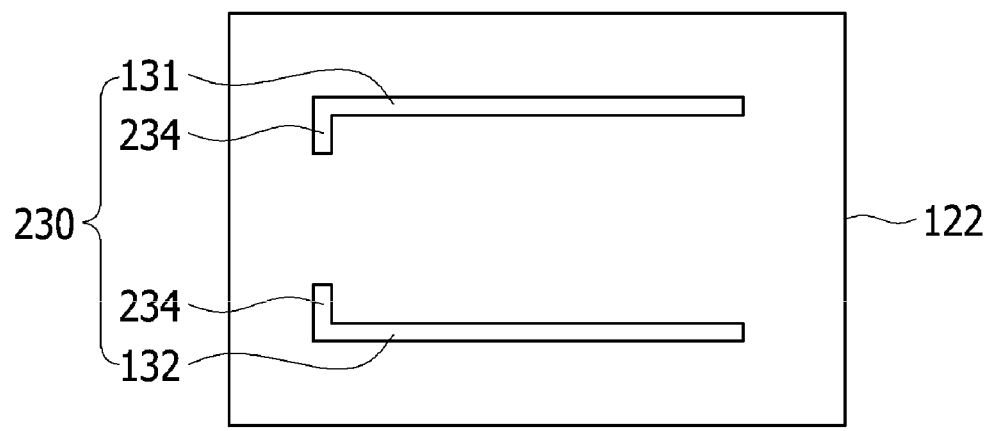

As shown in FIG. 11, a fixing member 230 may include third portions 234 that extend toward each other from one side of the first portion 131 and the second portion 132. In other words, the fixing member 230 has a shape in which a middle part of the third portion 133 connecting the first portion 131 and the second portion 132 is cut off from the fixing member 130' of FIG. 10.

Like this, it is possible to confine the conductive elastic portion 110 even when the fixing member 230 is formed not to connect the first portion 131 and the second portion 132, and thus a material for forming the fixing member 230 may be reduced.

Figure 12:
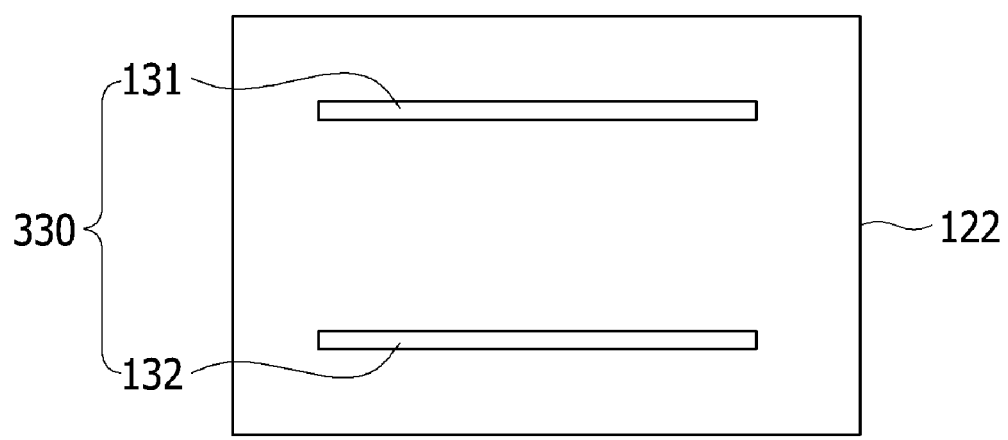

As shown in FIG. 12, a fixing member 330 may be formed only on two sides of the conductive elastic portion 110 in the width direction. In other words, the fixing member 330 may include the first portion 131 and the second portion 132 only.

Like this, even when the fixing member 330 is provided on the two sides of the clip-shaped conductor 110 in the width direction to prevent the conductive elastic portion 110 from being deviated to the left or right, an alignment function may be achieved. Therefore, a material of the fixing member 130 may be further reduced, and economical efficiency may be improved.

Figure 13:
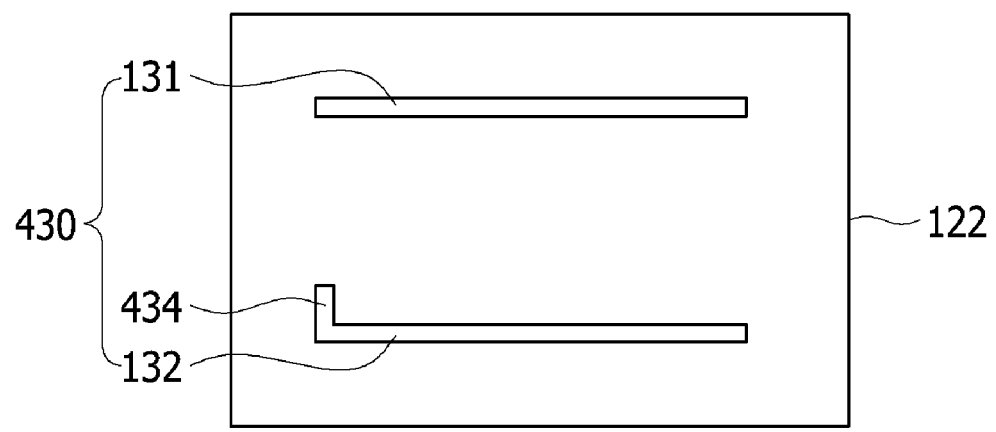

As shown in FIG. 13, a fixing member 430 includes a third portion 434 extending from the second portion 132. In other words, in the fixing member 430, the third portion 234 of the fixing member 230 of FIG. 11 is formed on the second portion 132 only.

It has been described that the third portion 434 is formed at the second portion 132, but the third portion 434 may be formed to extend from any one of the first portion 131 and the second portion 132.

Like this, even when the fixing member 430 is not formed to connect the first portion 131 and the second portion 132, but the vertical extension 434 is formed at a part of any one of the first portion 131 and the second portion 132, it is possible to confine the clip-shaped conductor 110. Therefore, a material for forming the fixing member may be further reduced compared to the fixing member 230 of FIG. 11.

As described above, patterns of the fixing members 130', 230, 330, and 430 may be determined in appropriate forms according to economical efficiency of a material and alignment precision of the conductive elastic portion 110. In other words, in the case of an element important for positional alignment of the conductive elastic portion 110, the fixing member 130' may be formed on three sides of the conductive elastic portion 110 except the boundary of a curved portion 112 as shown in FIG. 10, and in the case of an element important for economical efficiency, the fixing member 330 may be formed around only parts of the boundary of the conductive elastic portion 110 including two sides of the conductive elastic portion 110 in the width direction as shown in FIG. 12.

In FIGS. 8 and 9, it has been shown and described that stoppers are not provided in the second electrode 122, but only the fixing member 130 is provided in the functional contactor 100', but the present invention is not limited to this configuration.

As an example, the fixing member 130 may be provided on the stoppers 122a to 122d shown in FIGS. 2 to 7 to fix the conductive elastic portion 110 on the second electrode 122 of the functional device 120.

The functional device 120 will be described in detail below with reference to FIG. 14 and subsequent drawings. Briefly referring to the functional device 120, however, a sintered body 120a may be formed between the first electrode 121 and the second electrode 122. The sintered body 120a may be formed of a ceramic material or a varistor material. In addition, the sintered body 120a may include an internal electrode.

The functional device 120 may break leakage current of an external power supply flowing from a ground of the circuit board 14 to the conductor 12. A breakdown voltage Vbr or a withstand voltage of the functional device 120 may be higher than a rated voltage of the external power supply of the electronic device. The rated voltage may be a country-specific standard rated voltage, for example, any one of 240 V, 110 V, 220 V, 120 V, and 100 V.

When the conductor 12 has an antenna function, the first electrode 121 and the second electrode 122 of the functional device 120 disposed on the sintered body 120a at a predetermined distance from each other function as a capacitor as well. Therefore, it is possible to break leakage current of the external power supply and pass along a communication signal flowing in from the conductor 12 or the circuit board 14.

Also, the functional device 120 may pass electrostatic discharge (ESD) flowing in from the conductor 12 without dielectric breakdown. Here, the breakdown voltage Vbr of the functional device 120 may be lower than a dielectric breakdown voltage Vcp of the sintered body 120a.

Therefore, the functional contactor 100 may pass communication signals, ESD, etc. by electrically connecting the conductor 12 and the circuit board 14 but may break leakage current of the external power supply from the circuit board 14 so that the leakage current may not be transferred to the conductor 12.

When the conductive elastic portion 110 and the functional device 120 are integrally provided as described above, an additional space for separately disposing the conductive elastic portion 110 and the functional device 120 is unnecessary. Therefore, such a structure may be appropriate for a reduction in the size of a portable electronic device.

The functional contactors 100 and 100' according to the first embodiment of the present invention will be described in further detail below with reference to FIGS. 14 to 18.

Figure 14:
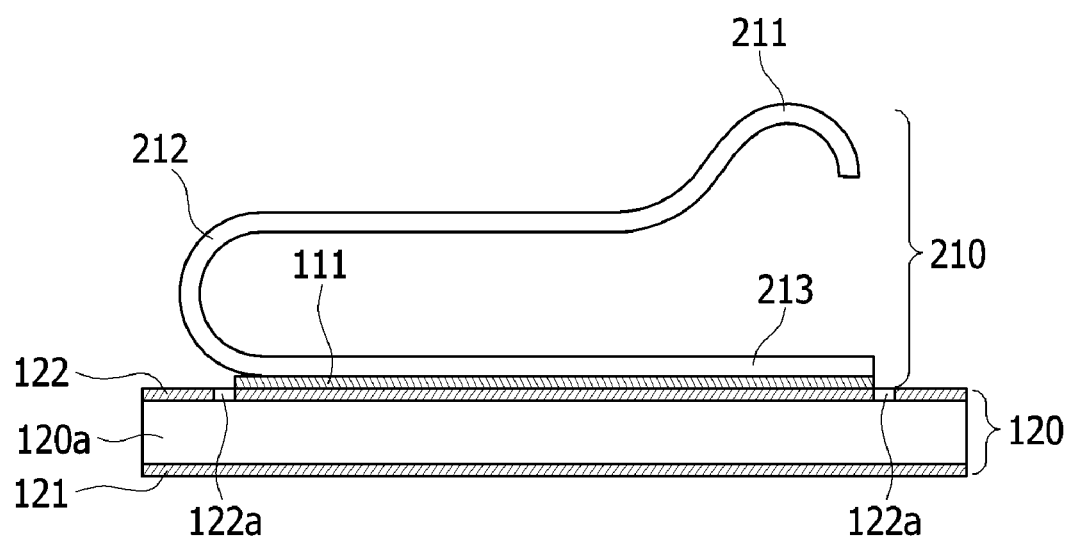
FIGS. 14 and 15 are cross-sectional views showing other examples of the functional contactor according to the first embodiment of the present invention.

As shown in FIG. 14, when the conductive elastic portion 110 is a clip-shaped conductor 210, the clip-shaped conductor 210 includes a contact portion 211, a curved portion 212, and a terminal portion 213.

The clip-shaped conductor may be a C-clip generally formed in "C" shape. The clip-shaped conductor 210 is in linear contact or point contact with the conductor 12 and thus may be adequately protected against galvanic corrosion.

The contact portion 211 has a curved shape and may be in electrical contact with the conductor 12. The curved portion 212 is formed to extend from the contact portion 211 and may have elasticity. The terminal portion 213 may include a terminal which is electrically connected to the functional device 120.

The contact portion 211, the curved portion 212, and the terminal portion 213 may be integrally formed of a conductive material having elasticity.

The functional device 120 includes the first electrode 121, the second electrode 122, and the sintered body 120a. The functional device 120 may be a capacitor.

A plurality of sheet layers are sequentially laminated, and electrodes provided in one side of the sheet layers are disposed to face each other. After that, the sheet layers are integrally formed into the sintered body 120a through compression and firing processes.

The sintered body 120a may be formed of an insulating material having a dielectric constant, for example, a ceramic material. Here, the ceramic material is a metal-based oxidized compound, which may include one or more selected from $Er_2O_3$, $Dy_2O_3$, $Ho_2O_3$, $V_2O_5$, CoO, $MoO_3$, $SnO_2$, $BaTiO_3$, and $Nd_2O_3$.

In the functional device 120, the dielectric constant of the sintered body 120a, a thickness between the first electrode 121 and the second electrode 122, and areas of the first electrode 121 and the second electrode 122 may be set so that a withstand voltage of the functional device 120 may be higher than the rated voltage of the external power supply of the electronic device and a capacitance through which a communication signal flowing in from the conductor 12 or the circuit board 14 passes may be formed.

The functional device 120 configured as described above may prevent damage to a user, such as electric shock through the conductor 12, or damage to internal circuitry. For example, when leakage current of the external power supply flows in from the ground of the circuit board 14, the functional device 120 may not pass but may break the leakage current because the withstand voltage between the first electrode 121 and the second electrode 122 is higher than the rated voltage of the external power supply.

Also, when a communication signal flows in from the conductor 12 or the circuit board 14, the functional device 120 may perform a communication signal transfer function by serving as a capacitor.

Further, when ESD flows in from the conductor 12, the functional device 120 may pass the ESD from the outside of the sintered body 110a through the gap between the first electrode 121 and the second electrode 122 without dielectric breakdown. The ESD is transferred to the ground of the circuit board 14 so that the internal circuitry may be protected.

Figure 15:
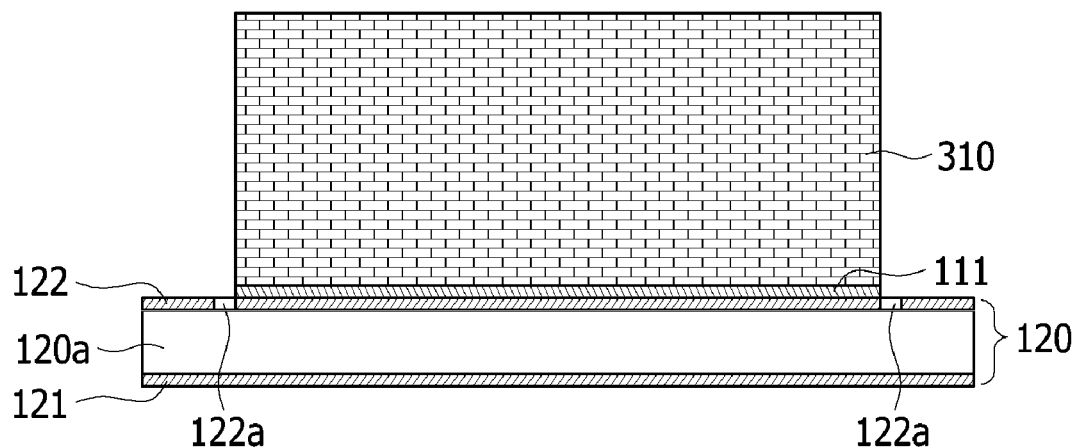

When the conductive elastic portion 110 is a conductive gasket 310 as shown in FIG. 15, the conductive gasket 310 may be integrally formed of a conductive material having elasticity.

The conductive gasket 310 may include at least one of, for example, a polymer body fabricated by thermally compressing a conductive paste, natural rubber, sponge, synthetic rubber, heat-resistant silicone rubber, and a tube.

The conductive gasket is not limited thereto and may include an elastic conductive material. For example, when the conductive gasket is a silicone rubber pad, the silicone rubber pad may include a body and a conductive wire.

The body may be formed of silicone rubber. One side of the body may be in surface contact with the conductor 12, and the other side may be electrically connected to the functional device 120.

The conductive wire may be formed vertically and/or diagonally in the body. The conductive wire is intended to improve electrical contact with the conductor 12 and also complement elasticity of the body.

In correspondence with the conductive wire, the conductive gasket may show excellent conductivity for communication signals and favorable elastic restoring force and may be used for a long period of time.

Alternatively, the conductive gasket may be a silicone rubber pad including conductive particles. A body of the silicone rubber pad may include a conductive portion, in which conductive silicone rubber and conductive particles are regularly or irregularly distributed, and a through hole including the conductive silicone rubber and the conductive particles.

When pressure or heat is not applied from the outside to the conductive particles, the conductive particles are separated from each other and become non-conductive. When pressure or heat is applied from the outside to the conductive particles, the conductive particles may come in contact with each other and become conductive due to contraction of the conductive silicone rubber.

The conductive portion may establish electrical contact with the conductor 12 due to the conductive particles and may also be contracted or expanded due to the conductive silicone rubber. Therefore, the conductive portion may simultaneously provide electrical contact and elastic restoring force caused by pressurization.

Figure 16:
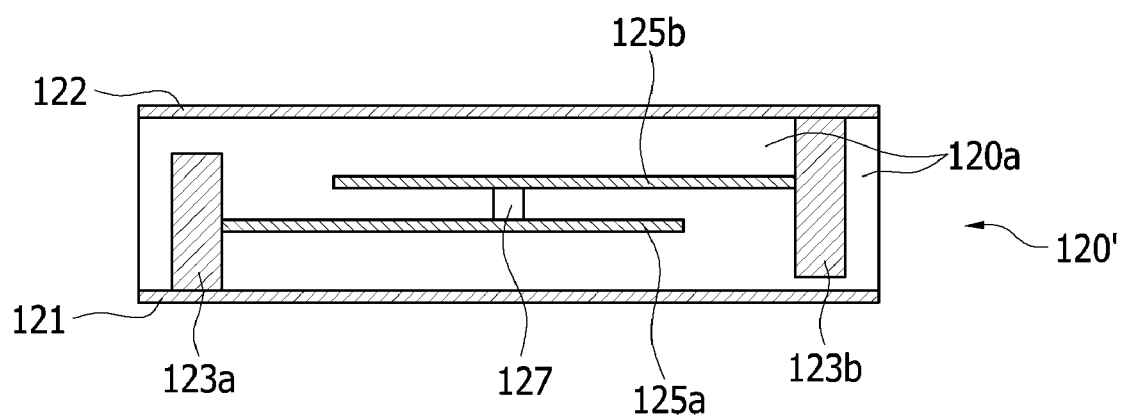
FIGS. 16 to 18 are cross-sectional views showing various shapes of a functional device in the functional contactor according to the first embodiment of the present invention.
Figure 17:
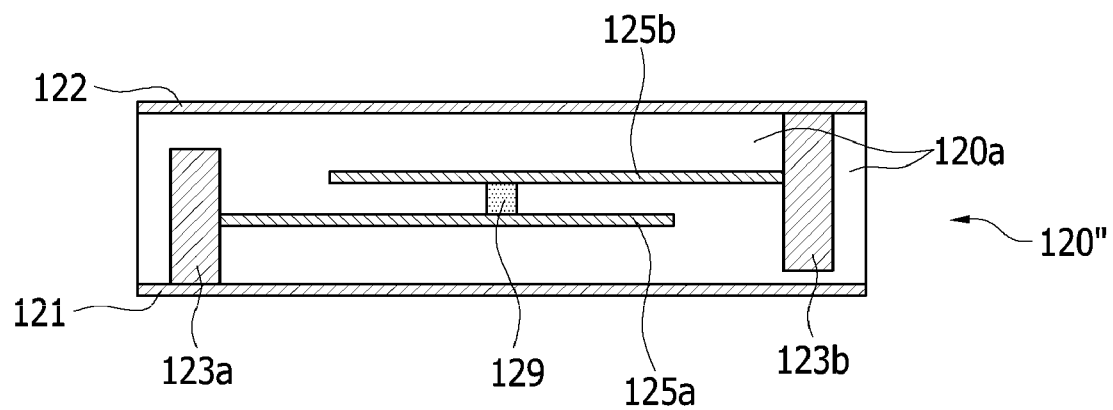

FIGS. 16 and 17 schematically show examples of functional devices 120' and 120" configured as suppressors. As shown in FIGS. 16 and 17, according to the present invention, the functional devices 120' and 120" may include the first and second electrodes 121 and 122, the sintered body 120a, and one pair of internal electrodes 125a and 125b disposed at a predetermined distance from each other in the sintered body 120a.

Intermediate electrodes 123a and 123b connected respectively to the first electrode 121 and the second electrode 122 may be provided on both sides of the sintered body 120a. In other words, the intermediate electrode 123a may be connected to the first electrode 121, and the intermediate electrode 123b may be connected to the second electrode 122.

The single pair of internal electrodes 125a and 125b may be formed at the predetermined distance from each other in the sintered body 120a. The single pair of internal electrodes 125a and 125b may be disposed to face each other vertically. The internal electrode 125a may be connected to the intermediate electrode 123a, and the internal electrode 125b may be connected to the intermediate electrode 123b.

The single pair of internal electrodes 125a and 125b and the single pair of intermediate electrodes 123a and 123b may include any of one or more components among Ag, Au, Pt, Pd, Ni, and Cu, and the first electrode 121 and the second electrode 122 may include any of one or more components among Ag, Ni, and Sn.

The single pair of internal electrodes 125a and 125b may be provided in various forms and patterns. The single pair of internal electrodes 125a and 125b may be provided in identical or different patterns. In other words, the single pair of internal electrodes 125a and 125b are not limited to a specific pattern as long as parts of the single pair of internal electrodes 125a and 125b are disposed to overlap and face each other when the sintered body is configured.

The distance between the single pair of internal electrodes 125a and 125b may be a distance for satisfying a breakdown voltage Vbr of the functional device 120', for example, 10 μm to 100 μm.

As shown in FIG. 16, an opening may be formed between the single pair of internal electrodes 125a and 125b. Also, as shown in FIG. 17, a discharged material layer may be formed in the entirety or a part of a formed opening 127. As an example, the opening 127 may be filled with the discharged material layer, or the discharged material layer may be applied to or coated on the internal wall of the opening 127. A discharged material constituting the discharged material layer has a low dielectric constant and no conductivity and is not short-circuited when an overvoltage is applied.

To this end, the discharged material may be a non-conductive material including at least one kind of metal particle and may be formed of a semiconductor material including SiC or a silicone-based component.

As an example, when the single pair of internal electrodes 125a and 125b include Ag, the discharged material may include a SiC—ZnO-based component. Although it has been described as an example that the discharged material includes a SiC—ZnO-based component, the discharged material is not limited thereto. As the discharged material, a non-conductive material including a semiconductor material or metal particles suitable for a component constituting the single pair of internal electrodes 125a and 125b may be used.

Although not shown in FIGS. 16 and 17, capacitor electrodes may be provided in parallel on at least one of upper sides and lower sides of the internal electrodes 125a and 125b. In other words, the functional devices 120' and 120" may be complex devices in which a suppressor and a capacitor are connected in parallel.

When leakage current of the external power supply flows in from the ground of the circuit board 14 of the electronic device, the functional devices 120' and 120" configured as described above may not pass, but break, the leakage current, because the breakdown voltage Vbr between the single pair of internal electrodes 125a and 125b is higher than the rated voltage of the external power supply.

Also, when a communication signal flows in from the conductor 12 or the circuit board 14, the functional devices 120' and 120" may perform a communication signal transfer function by serving as capacitors.

Further, when ESD flows in from the conductor 12, the functional devices 120' and 120" may pass the ESD through the opening 127 between the single pair of internal electrodes 125a and 125b without dielectric breakdown. The ESD is transferred to the ground of the circuit board 14 so that the internal circuitry may be protected.

Figure 18:
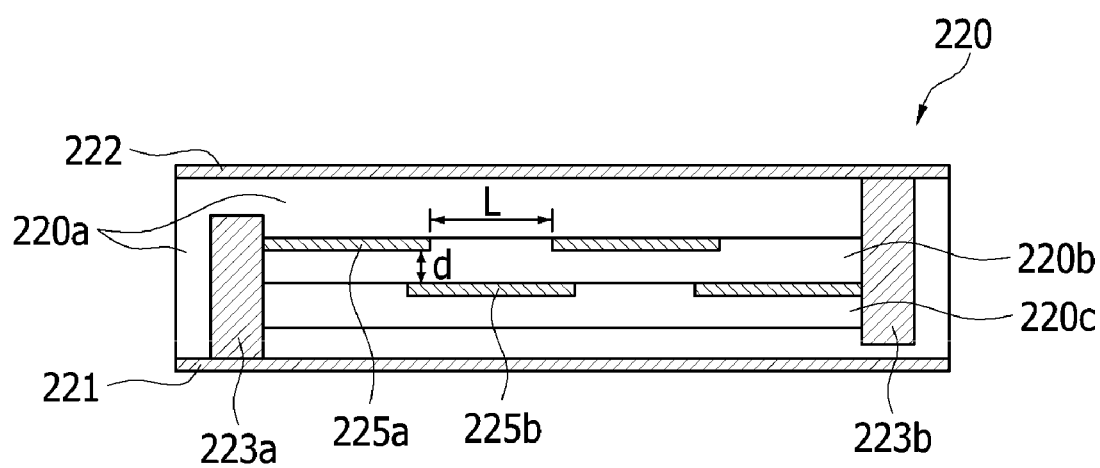

FIG. 18 schematically shows an example of a functional device 220 configured as a varistor. As shown in FIG. 18, the functional device 220 includes first and second electrodes 221 and 222, a sheet layer 220a, and first and second internal electrodes 225a and 225b disposed at a predetermined distance from each other in the sheet layer 220a.

On both sides of the functional device 220, intermediate electrodes 223a and 223b respectively connected to the first electrode 221 and the second electrode 222 may be provided. In other words, the intermediate electrode 223a may be connected to the first electrode 221, and the intermediate electrode 223b may be connected to the second electrode 222.

The sheet layer 220a is formed of a varistor material and may be composed of at least three layers which alternately include a first varistor material layer 220b and a second varistor material layer 220c. The first varistor material layer 220b and the second varistor material layer 220c may be formed of a semiconductor material including one or more of $ZnO$, $SrTiO_3$, $BaTiO_3$, and SiC or any one of a Pr-based material and a Bi-based material.

The first and second internal electrodes 225a and 225b may include a plurality of first internal electrodes 225a spaced apart by a predetermined distance L on the first varistor material layer 220b and a plurality of second internal electrodes 225b spaced apart by the predetermined distance L on the second varistor material layer 220c.

A breakdown voltage Vbr of the functional device 220 may be the sum of breakdown voltages between a first internal electrode 225a and a second internal electrode 225b which are closest to each other.

Each of the first internal electrodes 225a and the second internal electrodes 225b may be disposed so that at least a part thereof does not overlap another electrode. In other words, the first internal electrode 225a and the second internal electrodes 225b may be alternately disposed so that at least parts thereof overlap each other, or may be alternately disposed therebetween so as to not overlap each other.

The distance between the first internal electrodes 225a or the second internal electrodes 225b may be set so that static electricity or leakage current may not leak to an adjacent position of the first internal electrodes 225a and the second internal electrodes 225b and may move between the first internal electrodes 225a and the second internal electrodes 225b normally.

For example, the distance L between one first internal electrode 225a and a neighboring first internal electrode 225a or the distance L between one second internal electrode 225b and a neighboring second internal electrode 225b may be larger than a shortest distance d between the first internal electrodes 225a and the second internal electrode 225b.

Although not shown in FIG. 18, capacitor electrodes may be provided in parallel on at least one of upper sides and lower sides of the first internal electrodes 225a and the second internal electrodes 225b. In other words, the functional device 220 may be a complex device in which a varistor and a capacitor are connected in parallel.

When leakage current of the external power supply flows in from the ground of the circuit board 14 of the electronic device, the functional device 220 configured as described above may not pass, but break, the leakage current because the breakdown voltage Vbr is higher than the rated voltage of the external power supply.

Also, when a communication signal flows in from the conductor 12 or the circuit board 14, the functional device 220 may perform a communication signal transfer function by serving as a capacitor.

Further, when ESD flows in from the conductor 12, the functional device 220 may pass the ESD without dielectric breakdown because the ESD is alternately moved between the first internal electrodes 225a and the second internal electrodes 225b. The ESD is transferred to the ground of the circuit board 14 so that the internal circuitry may be protected.

Figure 19:
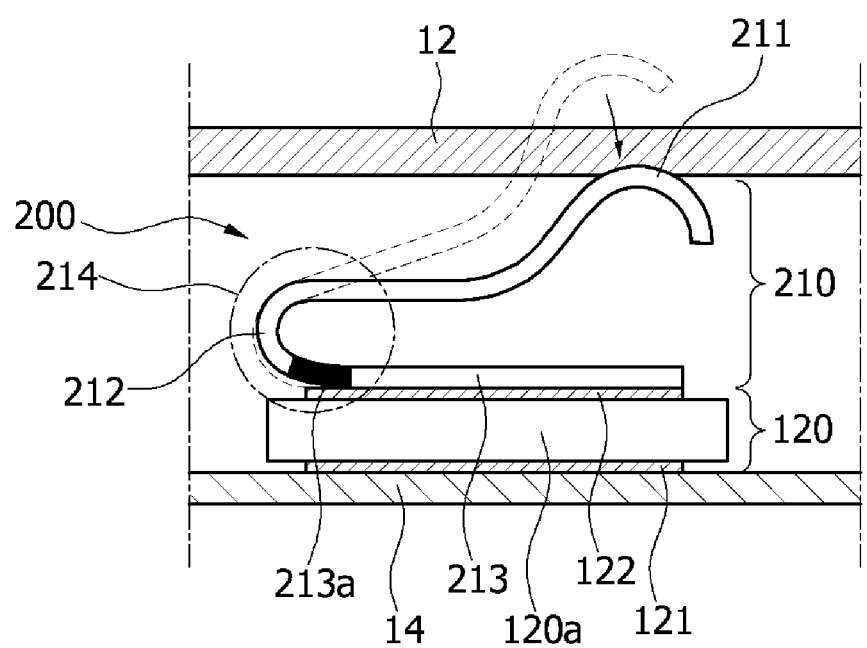
FIG. 19 is a cross-sectional view showing a functional contactor including a clip-shaped conductor according to a second embodiment of the present invention.

Meanwhile, when the conductive elastic portion 110 is the clip-shaped elastic conductor 210 as shown in FIG. 19, the clip-shaped conductor 210 may be in contact and conductive with the conductor 12.

In this case, a portion to which tension is significantly exerted according to movement of the contact portion 211, for example, a region 214 shown in FIG. 19 to include the curved portion 212 and parts of the contact portion 211 and the terminal portion 213 connected to the curved portion 212, may be referred to as a bending portion.

In the region 214 to which tension is exerted, a region coupled to the second electrode 122 through solder and/or a region to which heat is applied through a soldering process is defined as a bending portion 213a.

When tension occurs in the curved portion 212 due to movement of the contact portion 211, tension may also occur due to movement of the curved portion 212 in a part of the terminal portion 213 which is connected to the curved portion 212 and coupled to the second electrode through the solder.

When minute movement continues or is repeated due to tension exerted to the bending portion 213a as described above, the solder between the bending portion 213a and the second electrode 122 may be separated, or a part of the second electrode corresponding to the bending portion 213a may deviate from the sintered body 120a.

Also, when the clip-shaped conductor 210 is coupled to the functional device 120 by soldering, the bending portion 213a and a part of the curved portion 213a connected thereto are degraded in the soldering process. Therefore, elasticity and restoring force are decreased, and cracks are generated. In such cases, functions of a design stage may not be satisfied.

Therefore, when the clip-shaped conductor 210 is coupled to the functional device 120 by soldering, the second electrode 122 may be formed as shown in FIGS. 20 to 25 so that instrumental interference may not occur between the bending portion 213a and the functional device 120.

A functional contactor 200 according to a second embodiment of the present invention includes a first electrode 121 through which a functional device 120 coupled to a clip-shaped conductor 210 is electrically connected to the circuit board 14 or the conductor 12 of the electronic device and a second electrode on which the clip-shaped conductor is laminated through solder 111. The second electrode 122 is separately formed into a plurality of regions so that the solder 111 may not be exposed to a bending portion 213a formed in the clip-shaped conductor 210.

Figure 20:
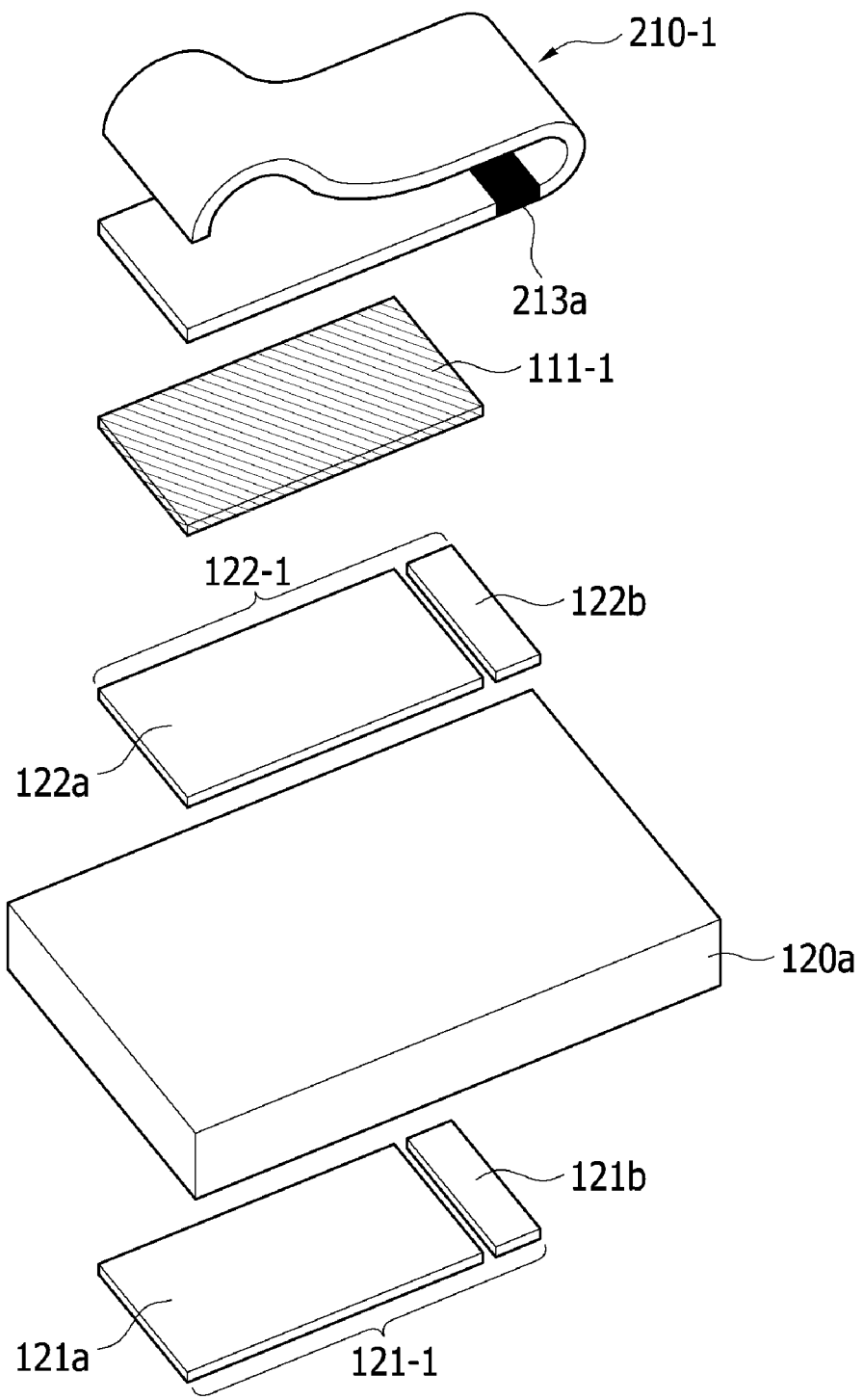
FIGS. 20 and 21 are a perspective view and a cross-sectional view of a functional contactor including an electrode divided into a plurality of regions on a surface of a functional device according to the second embodiment of the present invention.
Figure 21:
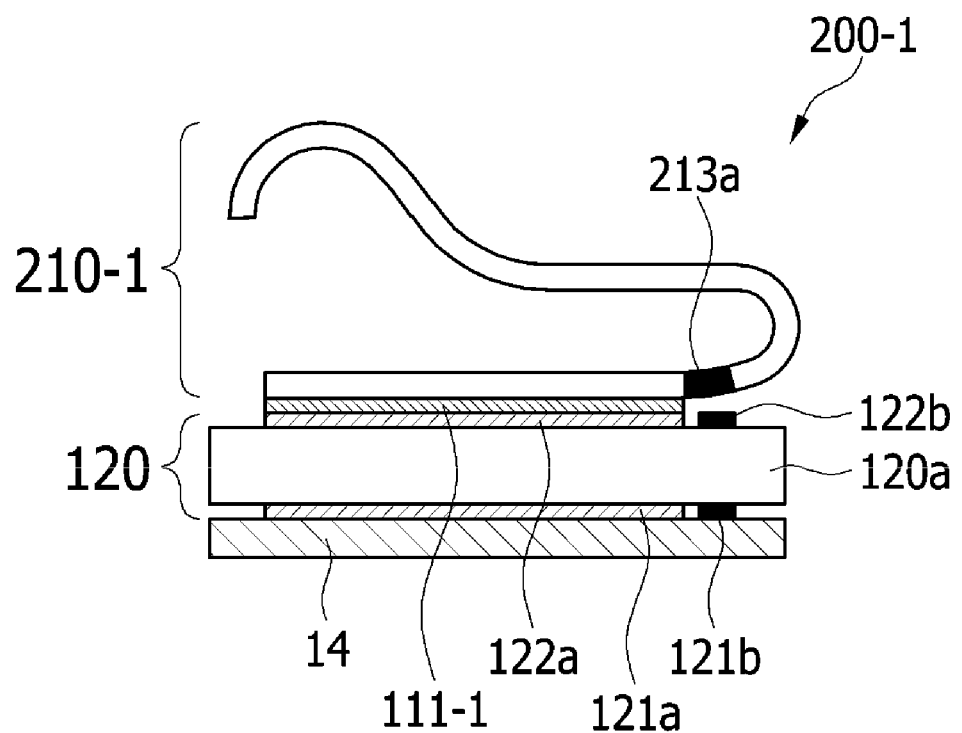

As shown in FIGS. 20 and 21, when an electrode is formed between a sintered body 120a and a clip-shaped conductor 210-1 in a functional contactor 200-1, electrodes 122a and 122b are formed on an upper surface of the sintered body 120a so that an electrode 122b of a region corresponding to the bending portion 213a is separated like a second electrode 122-1.

When the electrodes 122a and 122b are separately formed into two or more regions, previously separated conductors (or metal sheets) may be formed on the sintered body 120a, or patterns divided into two or more regions are formed on the sintered body 120a through masking or overglazing, and then the electrodes 122a and 122b may be formed in the corresponding regions.

When the clip-shaped conductor 210-1 is coupled to the functional device 120 by soldering, solder 111-1 may be formed on the electrode 122a to perform a soldering process. In this case, the solder 111-1 is not introduced onto the electrode 122b. Therefore, the bending portion 213a is not exposed to the solder, and a terminal portion 123 excluding the bending portion 213a may be fixed on the second electrode 122-1 formed on the sintered body 120a.

Also, the first electrode 121-1 may be formed to be identical or similar to a pattern for forming the second electrode 122-1. For example, when the first electrode 121-1 is formed using the pattern of the second electrode 122-1, it is unnecessary to distinguish between upper and lower surfaces of the functional device 120 the clip-shaped conductor 210-1 as shown in FIG. 21 during the process of coupling the clip-shaped conductor 210-1 to the functional device 120. Therefore, the process is simplified so that the manufacturing cost of the functional contactor 200 may be reduced.

Further, when the second electrode 122-1 is formed on the sintered body 120a, the electrode 122b may be excluded, and only the electrode 122a may be formed. When only the electrode 122a is formed on the sintered body 120a, there is no possibility for the solder 111-1 to be introduced onto a region of the sintered body 120a corresponding to the bending portion 213a during the soldering process. Therefore, it is possible to prevent the solder 111-1 from being exposed to the bending portion 213a.

Figure 22:
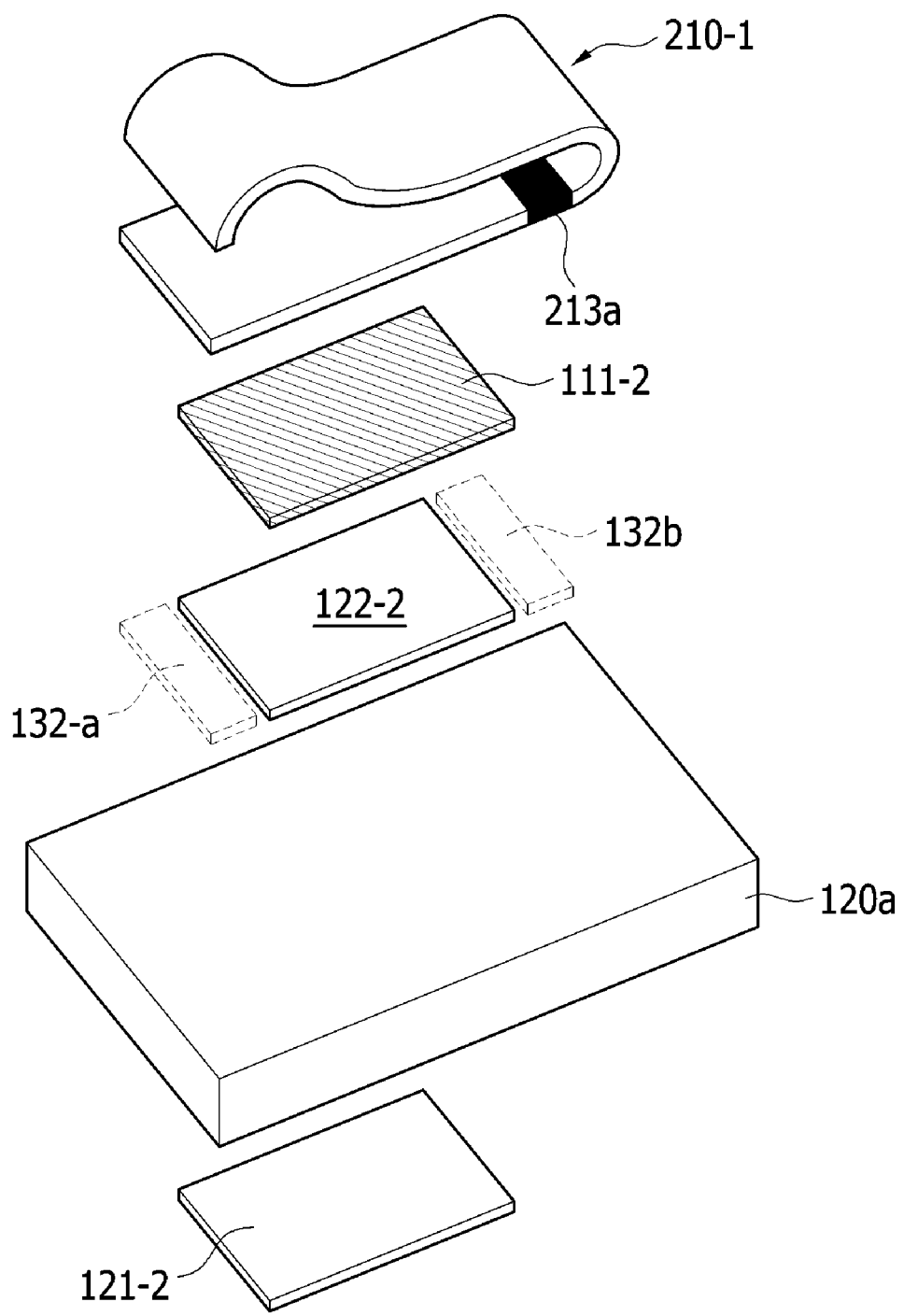
FIGS. 22 and 23 are a perspective view and a cross-sectional view showing another example of the functional contactor including an electrode divided into a plurality of regions on a surface of a functional device according to the second embodiment of the present invention.
Figure 23:
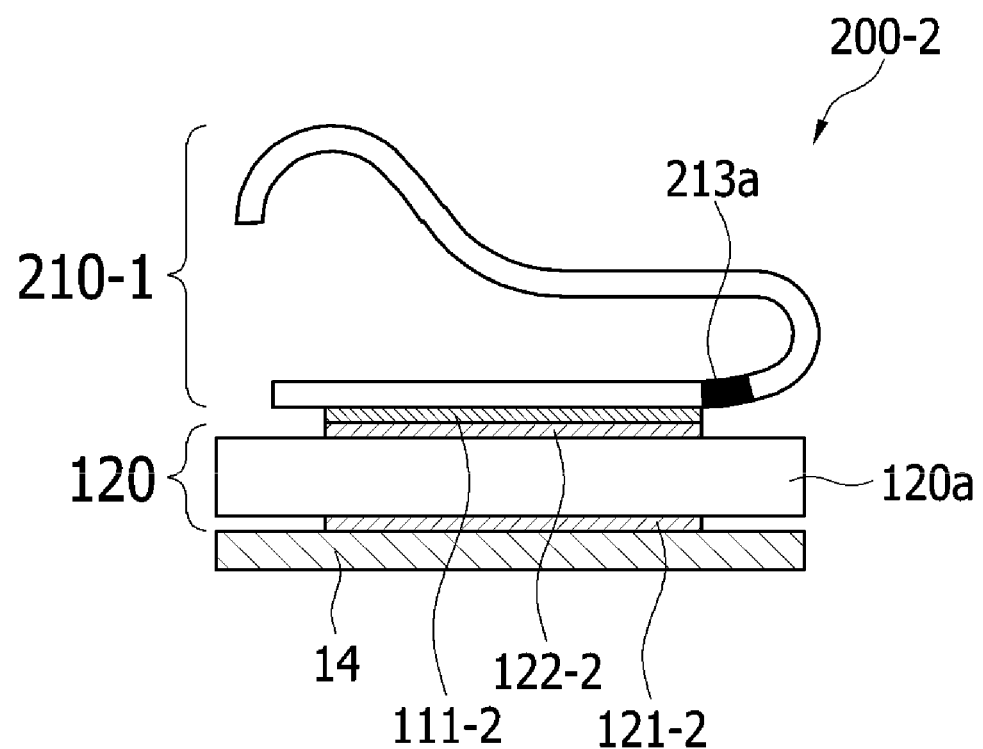

As shown in FIGS. 22 and 23, when an electrode is formed between the sintered body 120a and the clip-shaped conductor 210-1 in a functional contactor 200-2, a second electrode may be formed on the sintered body 120a to correspond to a part of a terminal portion 213 of the clip-shaped conductor 210-1 like the second electrode 122-2.

In this case, the second electrode 122-2 is formed at the center of the upper surface of the sintered body 120a and may be formed in a shape in which a region of a size identical or similar to the size (or area) of a region corresponding to the bending portion 213a is excluded from each of both ends 132a and 132b of the second electrode 122.

When the second electrode 122-2 is formed on the sintered body 120a as described above, the clip-shaped conductor 210-1 may be coupled to the functional device 120 regardless of a direction of the bending portion 213a. Therefore, unlike the case of coupling the clip-shaped conductor 210-1 to the functional device 120 using the formed electrode 122-1 in FIGS. 20 and 21, a process for determining a coupling direction is not required so that a resultant manufacturing cost may be reduced.

Figure 24:
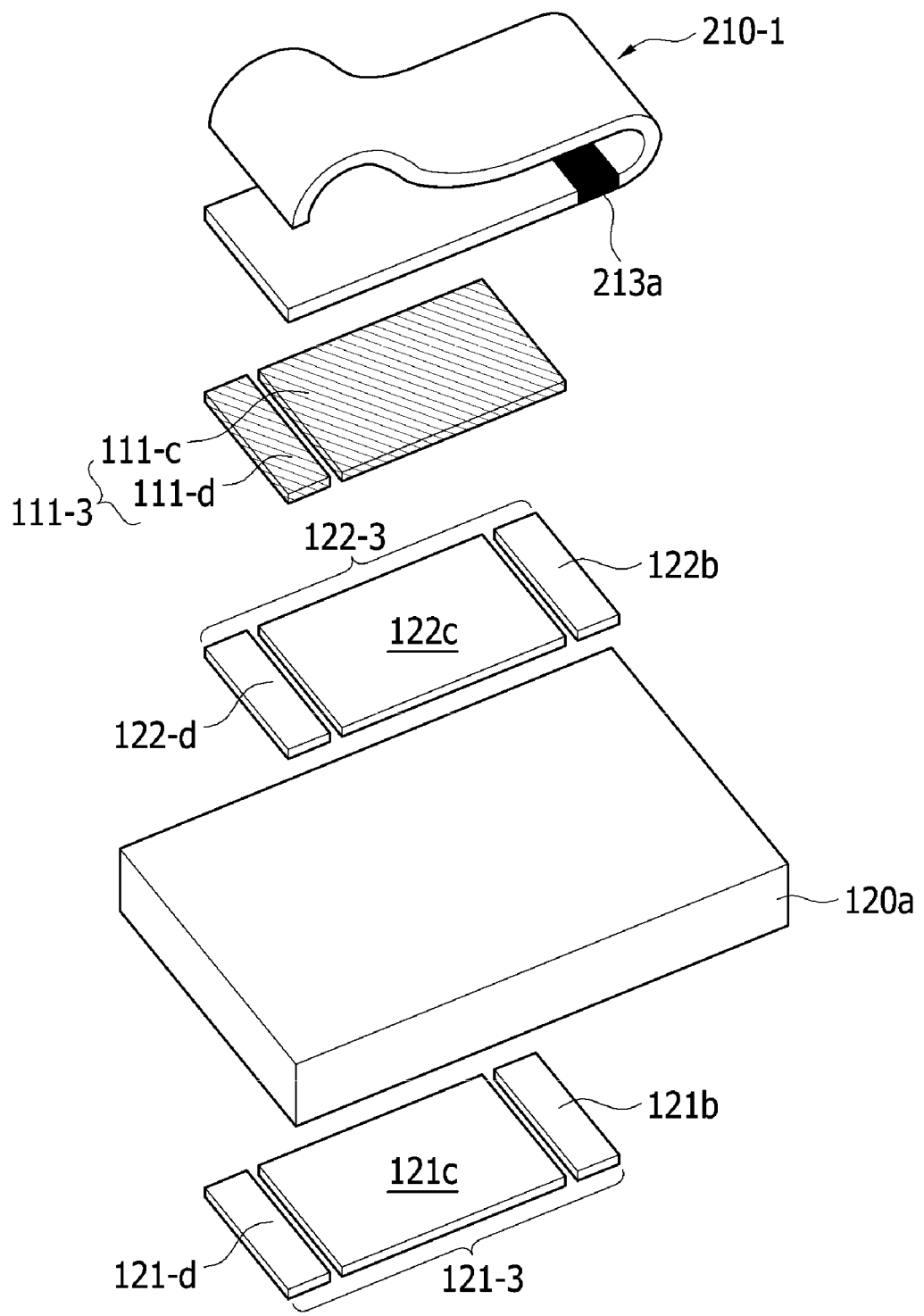
FIGS. 24 and 25 are a perspective view and a cross-sectional view showing another example of the functional contactor including an electrode divided into a plurality of regions on a surface of a functional device according to the second embodiment of the present invention.
Figure 25:
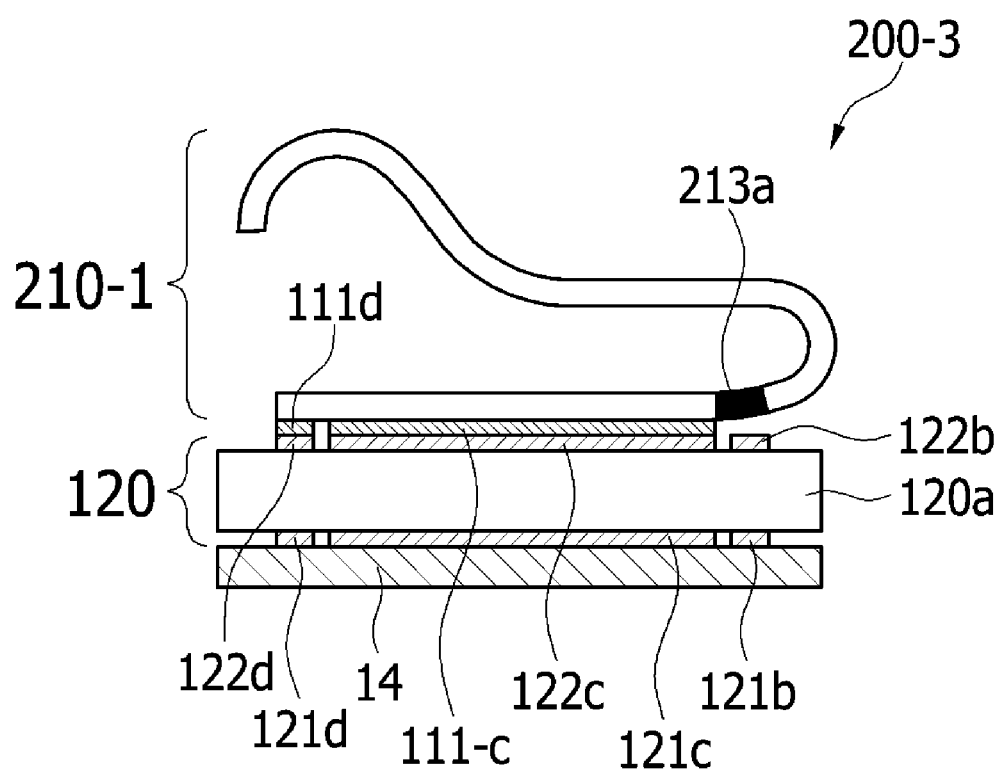

As shown in FIGS. 24 and 25, when an electrode is formed between the sintered body 120a and the clip-shaped conductor 210-1 in a functional contactor 200-3, the electrode may be divided into three regions (or blocks) like a second electrode 122-3. In this case, one electrode 122c may be disposed at the center of the upper surface of the sintered body 120a, and other divided electrodes 122b and 122d may be symmetrically disposed to the left and right of the electrode 122c. The electrode 122c disposed at the center of the upper surface of the sintered body 120a may be determined to have a maximum value in a length direction of the terminal portion 213 as long as it does not affect operation of the bending portion 213a and may be formed to have the largest area among the divided electrodes 122b, 122c, and 122d.

When the electrodes 122b, 122c, and 122d are disposed as described above, the clip-shaped conductor 210 may be coupled to the functional device 120-1 regardless of direction.

For example, when the clip-shaped conductor 210-1 is coupled to the functional device 120 by soldering as shown in FIG. 25, solder 111-3 is introduced onto the electrodes 122c and 122d so that the solder may not be exposed to the electrode 122b corresponding to the bending portion 213a.

When the solder 111-3 is formed on the at least two electrodes 122c and 122d among the formed electrodes 122b, 122c, and 122d, it is shown in FIG. 24 that pieces of solder 111c and 111d are formed on the electrodes 122c and 122d, respectively. However, a configuration of the solder 111-3 is not limited thereto, and one piece of solder may be formed on the electrodes 122c and 122d to perform a soldering process.

Also, when the clip-shaped conductor 210-1 is coupled to the functional device 120 in an opposite direction to a direction shown in FIG. 25, the solder 111-3 is introduced onto the electrodes 122b and 122c so that the solder may not be exposed to the electrode 122d corresponding to the bending portion 213a.

As described above, when the second electrode 122-3 divided into a plurality of regions (e.g., three regions) is disposed on the sintered body 120a and the electrodes 122b and 122d disposed at the both ends of the second electrode 122-3 are symmetrically formed in identical or similar sizes, it is possible to solve a problem in which the clip-shaped conductor 210 is disposed in a wrong direction or position on the structure of the electrodes 122a and 122b asymmetrically divided as shown in the electrode 122-1 of FIGS. 20 and 21.

Also, when the second electrode 122-3 divided into a plurality of regions (e.g., three regions) is disposed, it is possible to reduce a decrease in adhesive strength caused by a reduction in solder area and a change (e.g., a decrease) in capacitance caused by a reduction in electrode area as shown in FIGS. 22 and 23. Also, it is possible to ensure a degree of freedom in electrode design based on capacitance.

Further, the first electrode 121-3 may be formed on the sintered body 120a with a pattern which is identical or similar to a pattern of the second electrode 122-3. Since the first electrode 121-3 and the second electrode 122-3 are formed with identical or similar patterns, it is possible to omit a process of distinguishing between upper and lower portions of the functional device 120 and a process of determining a direction in which the clip-shaped conductor 210-1 is aligned with the functional device 120 when the clip-shaped conductor 210-1 is coupled, by soldering, to the functional device 120 on which the electrodes are formed. Therefore, it is possible to simplify a manufacturing process of the functional contactor 200 and reduce costs accordingly.

As described above, when the second electrodes 122-1 and 122-3 formed into a plurality of regions are formed on the sintered body 120a and a soldering process is performed so as to not expose the at least one electrode 122b corresponding to the bending portion 213a to solder, it is possible to prevent a decrease in elasticity and restoring force and damages, such as cracks, which may be caused in the bending portion 213a and a part of the curved portion 212 connected to the bending portion 213a during the soldering process.

Meanwhile, a functional contactor 200-4 according to a third embodiment of the present invention includes a first electrode 121 through which a functional device 120 coupled to a clip-shaped conductor 210-2 is electrically connected to the circuit board 14 or the conductor 12 of the electronic device and a second electrode on which the clip-shaped conductor is laminated through solder 111. A coating layer is formed on a part of a surface of the second electrode 122 so that the solder 111 may not be exposed to a bending portion 213a formed in the clip-shaped conductor 210.

Figure 26:
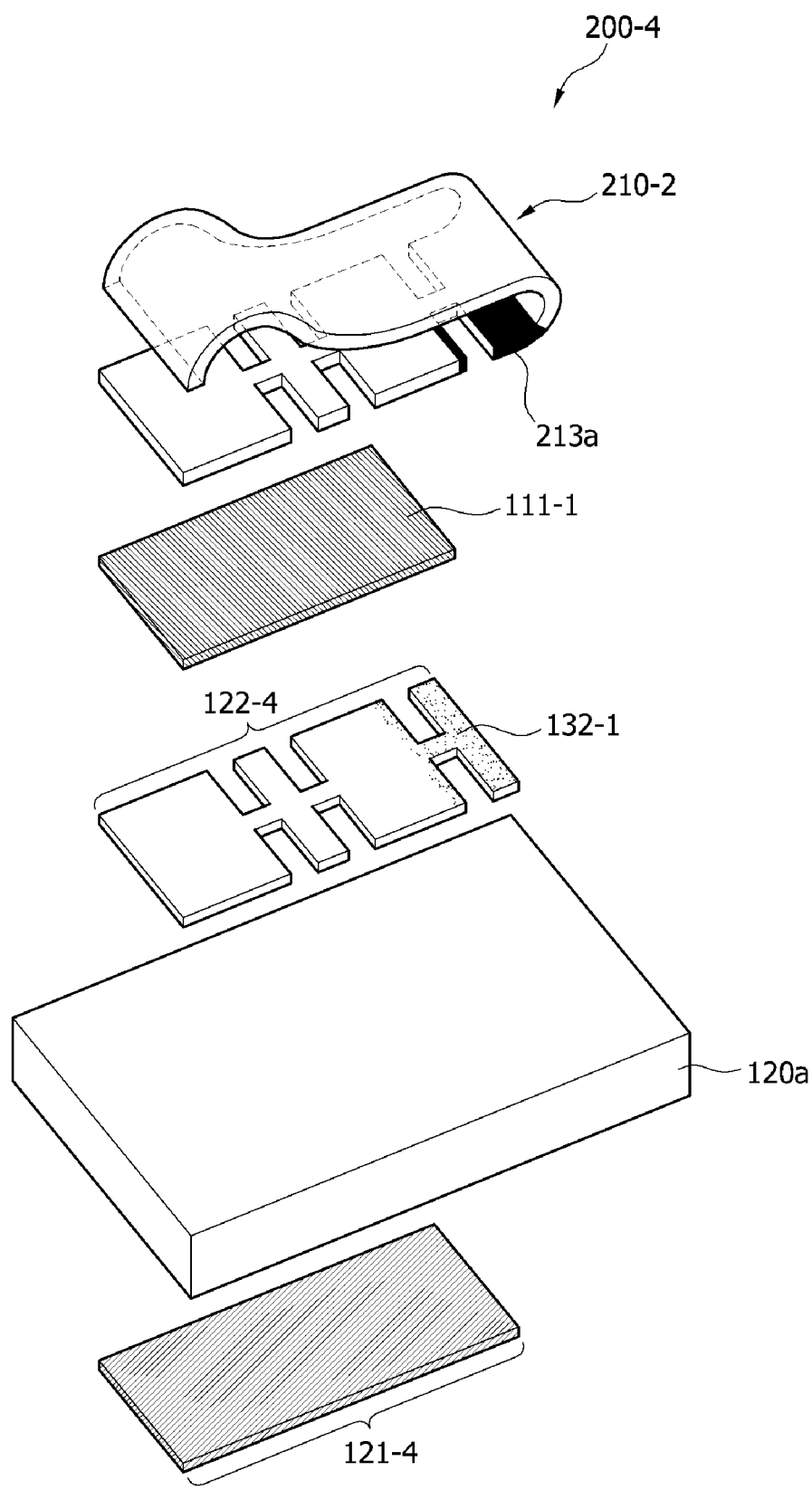
FIGS. 26 and 27 are a perspective view and a cross-sectional view of a functional contactor including an electrode, on which a coating layer is formed, on a surface of a functional device according to a third embodiment of the present invention.
Figure 27:
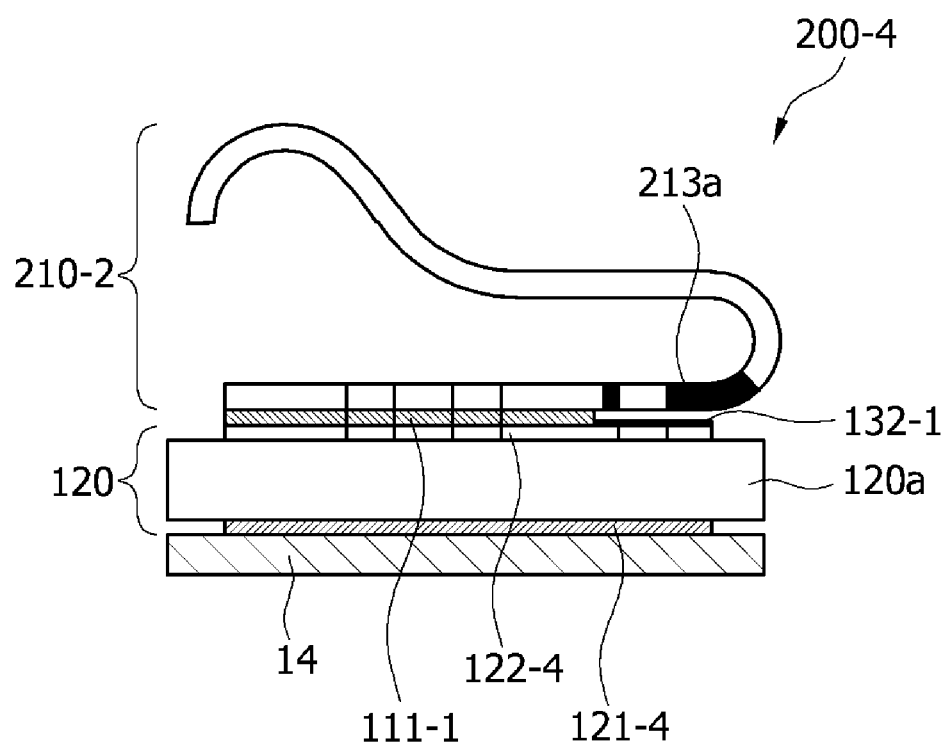

As shown in FIGS. 26 and 27, when an electrode is formed between a sintered body 120a and the clip-shaped conductor 210-2 in the functional contactor 200-4, a coating layer 132-1 is formed on a part of a surface, such as the second electrode 122-4, corresponding to the bending portion 213a.

A material for lowering and/or removing wetness with the solder 111 or 111-1 is applied to the coating layer 132-1 formed on the second electrode 122-4. For example, it is possible to coat the surface of the second electrode 122-4 corresponding to the bending portion 213a with a material such as ceramic and a non-flammable petroleum compound. Also, the coating layer 132-1 formed on the second electrode 122-4 may be deposited or bonded in the form of a film. For example, the coating layer 132-1 may be formed on the second electrode 122-4 through masking or overglazing.

The second electrode 122-4 coupled onto the sintered body 120a may be formed in various areas and/or patterns. The coating layer 132-1 may be formed when the second electrode 122-4 has been coupled to the sintered body 120a, or the second electrode 122-4 may be coupled to the sintered body 120a after the coating layer 132-1 is formed on the second electrode 122-4.

When the clip-shaped conductor 210-2 is coupled to the functional device 120 by soldering, the solder 111-1 may be formed on the electrode 122-4 so that a soldering process may be performed. In this case, the solder 111-1 is formed on an upper surface of the second electrode 122-4 and is not introduced onto a region in which the coating layer 132-1 is formed. Therefore, the bending portion 213a is not exposed to the solder, and the terminal portion 123 excluding the bending portion 213a may be fixed on the second electrode 122-4 coupled to the sintered body 120a.

As described above, when a soldering process is performed so as to not expose the coating layer 132-1 of the second electrode 122-4 corresponding to the bending portion 213a to the solder 111-1, it is possible to prevent a decrease in elasticity and restoring force and damages, such as cracks and degradation, which may be caused in the bending portion 213a and a part of the curved portion 212 connected to the bending portion 213a during the soldering process.

Areas and patterns of the first electrode 121-4 and the second electrode 122-4 formed on the sintered body 120a may be determined so that the functional device 120 and/or the contactor 200-4 including the functional device 120 may have a specific capacitance.

For example, as shown in FIG. 26, areas and patterns of the first electrode 121-4, the second electrode 122-4, and the terminal portion 213 may be determined so that the functional device 120 or the contactor 200-4 including the functional device 120 and the clip-shaped conductor 210-2 may have a capacitance of a designated value (e.g., 25 pF or 45 pF).

When the area and/or pattern of the second electrode 122-4 is determined in consideration of the capacitance of the contactor, it is possible to increase the capacitance by making the area of the second electrode larger than the area of the terminal portion 213 formed in a specific pattern.

For example, as shown in FIG. 26, the second electrode 122-4 may be formed to extend in a direction toward the bending portion 213, and the coating layer 132-1 may be formed in a region corresponding to the bending portion 213.

Figure 28:
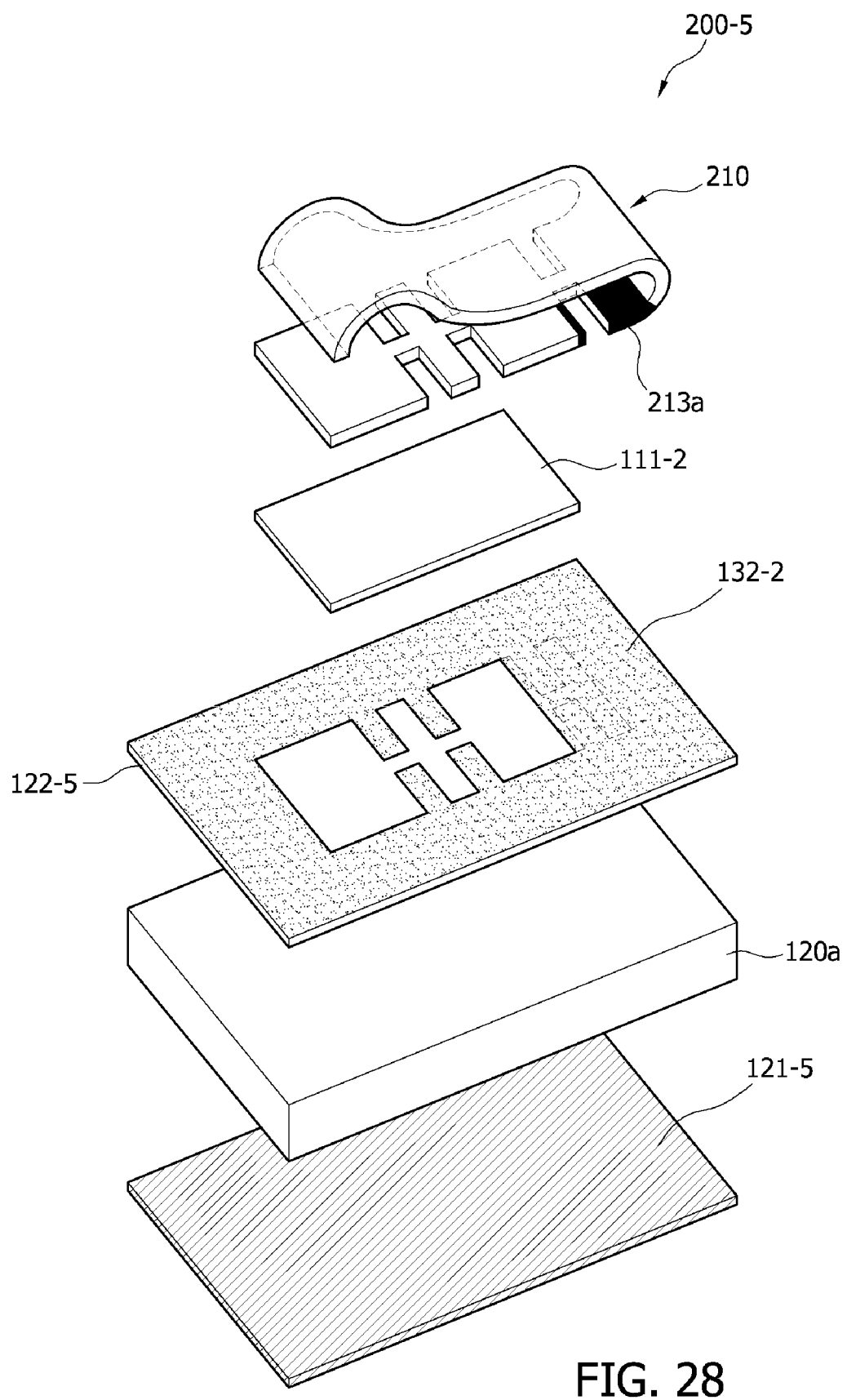
FIGS. 28 and 29 are a perspective view and a cross-sectional view showing another example of the functional contactor including an electrode, on which a coating layer is formed, on a surface of a functional device according to the third embodiment of the present invention.
Figure 29:
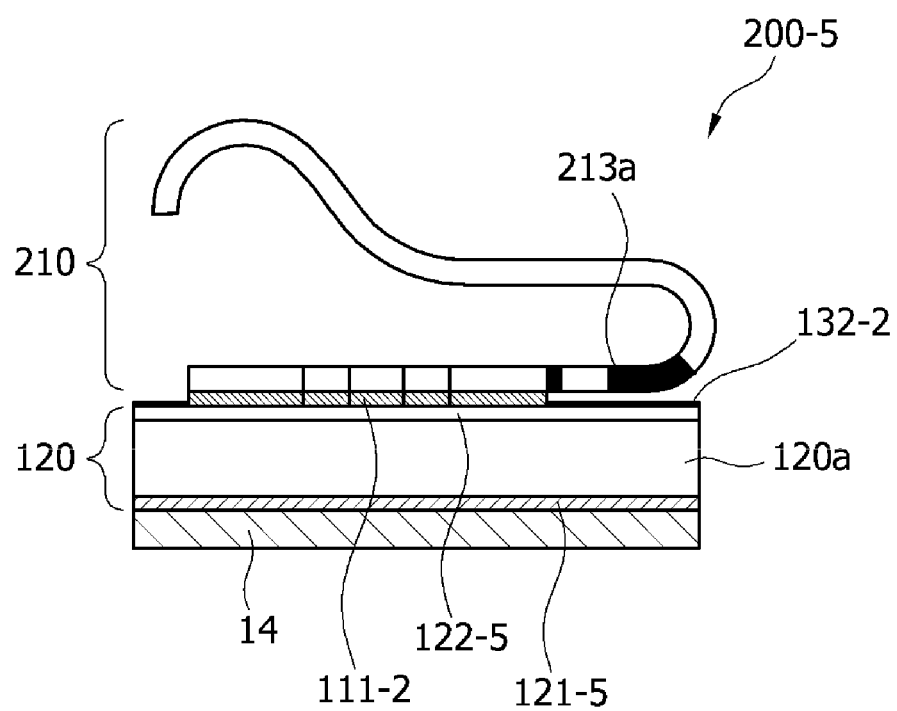

As shown in FIGS. 28 and 29, when an electrode is formed between the sintered body 120a and the clip-shaped conductor 210-2 in a functional contactor 200-5, an electrode (e.g., a large-area electrode) is configured as a second electrode 122-5, and a coating layer 132-2 may be formed on a part of a surface of the second electrode 122-5 including a region corresponding to the bending portion 213a.

For example, when electrodes 121-5 and 122-5 of the functional device 120 are formed in consideration of a capacitance of the contactor 200-5, the second electrode 122-5 may be formed to have a larger area than the terminal portion 213 of the clip-shaped conductor 210-2 soldered on the second electrode 122-5.

In this case, the coating layer 132-2 is formed on a part of the second electrode 122-5 excluding a pattern of the terminal portion 213, and a soldering process may be controlled so that solder 111-2 may not be exposed to the second electrode 122-5 excluding a region corresponding to a shape of the terminal portion 213.

When the clip-shaped conductor 210-2 is fixed on the second electrode 122-5 using solder 122-2, the solder 111-2 may be introduced to a designed position through the coating layer 132-2 formed on the second electrode 122-5, and then the terminal portion 213 may be fixed.

In other words, when the coating layer 132-2 is formed in a partial region of the second electrode 122-5 corresponding to the bending portion 213a, the solder 111-2 may be selectively positioned on the second electrode 122-5 on which the coating layer 132-2 has not been formed according to a pattern of the coating layer 132-2.

Therefore, it is easy to align a position of the clip-shaped conductor 210-2 coupled onto the second electrode 122-5 according to the cohesive force of the selectively introduced solder 111-2, and thus it is possible to uniformly maintain quality of the contactor 200-5 relating to capacitance and constant voltage characteristics.

Also, the bending portion 213a in which tension is exerted continuously or repeatedly is not fixed to a functional device by the formed coating layer 132-2. Therefore, elasticity and restoring force of the clip-shaped conductor 210-2 are increased, and it is possible to prevent a minute change in capacitance and/or a change in constant voltage characteristics caused by movement of the bending portion 213a.

Alternatively, the first patterns 121-4 and 121-5 formed on the functional device 120 may be formed in patterns identical or similar to patterns of the second electrodes 122-4 and 122-5. As described above, when the first electrode and the second electrode are formed in identical or similar patterns, it is unnecessary to distinguish between upper and lower surfaces of the functional device 120 during a process of coupling the clip-shaped conductor 210 to the functional device 120. Therefore, the process is simplified, and a manufacturing cost of the functional contactor 200 may be reduced accordingly.

Although exemplary embodiments of the present invention have been described above, the spirit of the present invention is not limited to the embodiments set forth in this specification. Those of ordinary skill in the art should appreciate that other embodiments may be easily derived by addition, modification, omission, alteration, etc. of components within the spirit of the present invention, and the other embodiments are also within the scope of the present invention.

The invention claimed is:

1. A functional contactor comprising:
a conductive elastic portion configured to be in electrical contact with a conductor of an electronic device and have elasticity; and
a functional device including a first electrode electrically connected to a circuit board or the conductor of the electronic device and a second electrode on which the conductive elastic portion is laminated through solder,
wherein the second electrode includes a stopper in which no electrode is formed to prevent the solder from being introduced into a periphery of a lamination region on which the conductive elastic portion is laminated.

2. The functional contactor of claim 1, wherein the stopper is provided to touch at least a part of the lamination region.

3. The functional contactor of claim 2, wherein the stopper is provided at least a diagonal point of a corner of the lamination region.

4. The functional contactor of claim 1, wherein the stopper is formed through masking or overglazing.

5. The functional contactor of claim 1, further comprising a fixing member configured to surround at least a part of a boundary of the conductive elastic portion.

6. The functional contactor of claim 5, wherein the fixing member is a non-conductive resin including any one of overglass, epoxy, epoxy with fillers, a polymer, and a non-conductive paste.

7. The functional contactor of claim 1, wherein the conductive elastic portion is any one of a conductive gasket, a silicone rubber pad, and a C-clip.

8. A functional contactor comprising:
a clip-shaped conductor configured to be in electrical contact with a conductor of an electronic device and have elasticity; and
a functional device including a first electrode electrically connected to a circuit board or the conductor of the electronic device and a second electrode on which the clip-shaped conductor is laminated through solder,
wherein the second electrode is separately formed into a plurality of regions so that the solder may not be exposed to a bending portion formed in the clip-shaped conductor.

9. The functional contactor of claim 8, wherein the second electrode is separately formed into three regions, and two electrodes positioned at both ends are symmetrically formed in identical or similar sizes.

10. The functional contactor of claim 9, wherein among the three regions, at least one region corresponding to the bending portion is not exposed to the solder.

11. The functional contactor of claim 8, wherein the second electrode is separately formed into the plurality of regions through masking or overglazing.

12. The functional contactor of claim 8, wherein the first electrode is formed in a pattern identical or similar to a pattern of the second electrode.

13. A functional contactor comprising:
a clip-shaped conductor configured to be in electrical contact with a conductor of an electronic device and have elasticity; and
a functional device including a first electrode electrically connected to a circuit board or the conductor of the electronic device and a second electrode on which the clip-shaped conductor is laminated through solder, wherein a coating layer is formed on at least a part of a surface of the second electrode so that the solder may not be exposed to a bending portion formed in the clip-shaped conductor.

14. The functional contactor of claim 13, wherein the coating layer determines wetness of the second electrode with the solder using at least one of ceramic and a non-flammable petroleum compound.

15. The functional contactor of claim 13, wherein the second electrode is formed in a pattern identical or similar to a pattern of a terminal portion, and
the coating layer is formed in a region of the second electrode corresponding to the bending portion.

16. The functional contactor of claim 13, wherein the second electrode is formed on an upper surface of the functional device to be exposed to an outside of a terminal portion, and
the coating layer is formed to exclude a region corresponding to a pattern of the second electrode and include a region corresponding to the bending portion.

17. The functional contactor of claim 13, wherein the coating layer is formed on the surface of the second electrode through masking or overglazing.

18. The functional contactor of claim 8, wherein the clip-shaped conductor includes:
a contact portion configured to be in contact with the conductor;
a curved portion having elasticity; and
a terminal portion configured to be in contact with the second electrode of the functional device.

19. The functional contactor of claim 1, wherein the functional device has at least one function among an electric shock prevention function for breaking leakage current of an external power supply flowing in from a ground of the circuit board of the electronic device, a communication signal transfer function for passing a communication signal flowing in from a conductive case or the circuit board, and an electrostatic discharge (ESD) protection function for passing static electricity without dielectric breakdown when the static electricity flows in from the conductive case.

* * * * *